(12) United States Patent
Seo et al.

(10) Patent No.: US 12,266,292 B2
(45) Date of Patent: Apr. 1, 2025

(54) DISPLAY DEVICE AND METHOD OF DRIVING THE SAME

(71) Applicant: Samsung Display Co., Ltd., Yongin-Si (KR)

(72) Inventors: Won Jin Seo, Yongin-si (KR); Tae Wan Kim, Yongin-si (KR); Hwa An Sung, Yongin-si (KR); Hyun Sik Yoon, Yongin-si (KR); Jeong Ah Lee, Yongin-si (KR); Dae Ho Hwang, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/221,893

(22) Filed: Jul. 14, 2023

(65) Prior Publication Data

US 2024/0135863 A1 Apr. 25, 2024
US 2024/0233616 A9 Jul. 11, 2024

(30) Foreign Application Priority Data

Oct. 25, 2022 (KR) .................. 10-2022-0138652

(51) Int. Cl.
*G09G 3/32* (2016.01)
*H05K 1/14* (2006.01)
*H05K 1/18* (2006.01)

(52) U.S. Cl.
CPC .............. *G09G 3/32* (2013.01); *H05K 1/142* (2013.01); *H05K 1/189* (2013.01);
(Continued)

(58) Field of Classification Search
CPC ................ G09G 3/32; G09G 2310/08; G09G 2320/0233; G09G 2320/041;
(Continued)

(56) References Cited

U.S. PATENT DOCUMENTS 9,235,125 B2 1/2016 Peeters et al.
10,096,300 B2 10/2018 Cheon et al.
(Continued)

FOREIGN PATENT DOCUMENTS

KR 10-2017-0097253 A 8/2017
KR 10-2012765 B1 8/2019
(Continued)

*Primary Examiner* — Rodney Amadiz
(74) *Attorney, Agent, or Firm* — Innovation Counsel LLP

(57) ABSTRACT

A display device includes a display unit including pixels connected to data lines and scan lines, first and second temperature sensors for sensing first and second temperatures of the display unit, a data driver configured to generate a data signal configured to be supplied to the data lines using output data, and attached to a first printed circuit board configured to be fixed to a rear surface of the display unit, a timing controller configured to generate the output data using input data, and attached to a second printed circuit board configured to be fixed to the rear surface of the display unit, and a storage having a temperature weight table including a weight corresponding to the first and second temperatures and a plurality of temperature tables including temperature information of the display unit corresponding to an attachment position of the second printed circuit board.

18 Claims, 14 Drawing Sheets

(52) U.S. Cl.
CPC . *G09G 2310/08* (2013.01); *G09G 2320/0233* (2013.01); *G09G 2320/041* (2013.01); *G09G 2330/021* (2013.01); *H05K 2201/10128* (2013.01); *H05K 2201/10151* (2013.01)

(58) Field of Classification Search
CPC .............. G09G 2330/021; G09G 3/20; G09G 2320/0276; G09G 2320/0673; G09G 2360/14; G09G 2320/0686; G09G 2320/029; G09G 2330/045; H05K 1/142; H05K 1/189; H05K 2201/10128; H05K 2201/10151
See application file for complete search history.

(56) References Cited

U.S. PATENT DOCUMENTS

| | | | |
|---|---|---|---|
| 11,587,488 B2* | 2/2023 | Pyun | G09G 3/2088 |
| 2016/0155384 A1 | 6/2016 | Km et al. | |
| 2022/0238079 A1* | 7/2022 | Yu | G09G 3/3426 |

FOREIGN PATENT DOCUMENTS

| | | |
|---|---|---|
| KR | 10-2034062 B1 | 10/2019 |
| KR | 10-2354392 B1 | 1/2022 |
| WO | 2013-127608 A2 | 9/2013 |

* cited by examiner

| BLK11 | BLK12 | BLK13 |
| --- | --- | --- |
| THIRD TEMPERATURE WEIGHT | THIRD TEMPERATURE WEIGHT | THIRD TEMPERATURE WEIGHT |
| BLK21 | BLK22 | BLK23 |
| FOURTH TEMPERATURE WEIGHT | SIXTH TEMPERATURE WEIGHT | FIFTH TEMPERATURE WEIGHT |
| BLK31 | BLK32 | BLK33 |
| FOURTH TEMPERATURE WEIGHT | SIXTH TEMPERATURE WEIGHT | SECOND TEMPERATURE WEIGHT |

~110

<DISPLAY PERIOD>

DISPLAY DEVICE AND METHOD OF DRIVING THE SAME

This application claims priority to Korean Patent Application No. 10-2022-0138652, filed on Oct. 25, 2022, and all the benefits accruing therefrom under 35 U.S.C. § 119, the content of which in its entirety is herein incorporated by reference.

BACKGROUND

1. Field

The disclosure relates to a display device and a method of driving the same.

2. Description of the Related Art

A display device includes a timing controller, a data driver, and a display unit, and the display unit includes a pixel.

In general, the timing controller may be mounted on a printed circuit board and then fixed to be positioned on a rear surface of the display unit. In this case, a temperature of the display unit may increase around a position of the printed circuit board.

When the temperature is different for each position of the display unit, even though the same data signal is supplied, a luminance and/or a color coordinate may be different for each position of the display unit, and thus a non-uniform image may be displayed.

SUMMARY

In accordance with an embodiment, a display device and a method of manufacturing the same capable of compensating for data in response to an attachment position of a printed circuit board, that is, in response to a temperature, so that a luminance of a display panel may be uniform is provided.

In addition, a display device and a method of driving the same, in which an image of the same or similar luminance is displayed in response to the same data signal even though a temperature is different for each position of the display unit is provided.

Features of the disclosure are not limited to the features described above, and other technical features which are not described will be clearly understood by those skilled in the art from the following description.

According to embodiments of the disclosure, a display device includes a display unit, a first temperature sensor, a second temperature sensor, a data driver, a timing controller, and a storage. The display unit includes pixels connected to data lines and scan lines. The first temperature sensor is for sensing a first temperature of the display unit and the second temperature sensor is for sensing a second temperature of the display unit. The data driver is configured to generate a data signal configured to be supplied to the data lines using output data, and is attached to a first printed circuit board configured to be fixed to a rear surface of the display unit. The timing controller is configured to generate the output data using input data, and is attached to a second printed circuit board to be fixed to the rear surface of the display unit. The storage has a temperature weight table including a weight corresponding to the first and second temperatures and a plurality of temperature tables including temperature information of the display unit corresponding to an attachment position of the second printed circuit board. The timing controller determines the attachment position of the second printed circuit board in response to the first temperature from the first temperature sensor and the second temperature from the second temperature sensor, and corrects the input data using a specific temperature table of the temperature tables, the specific temperature table corresponding to the attachment position of the second printed circuit board.

According to an embodiment, the first temperature sensor is mounted on the first printed circuit board, and the second temperature sensor is mounted on the second printed circuit board.

According to an embodiment, the display panel includes a first color pixel emitting light of a first color, a second color pixel emitting light of a second color, and a third color pixel emitting light of a third color, and the first color, the second color, and the third color are different colors.

According to an embodiment, the temperature weight table includes a first weight of the first color pixel, a second weight of the second color pixel, and a third weight of the third color pixel corresponding to a plurality of respective temperatures.

According to an embodiment, the display unit is divided into a plurality of blocks, and each of the plurality of temperature tables includes temperature information of the plurality of blocks corresponding to the attachment position of the second printed circuit board.

According to an embodiment, the timing controller includes a comparator, a determiner, and a second compensator. The comparator is configured to obtain a difference value between the first temperature and the second temperature. The determiner is configured to select a temperature table among the plurality of temperature tables using the difference value, and select the first weight, the second weight and the third weight in a unit of the plurality of blocks in response to a temperature of the plurality of blocks. The second compensator is configured to generate the output data by applying the first weight, the second weight, and the third weight in the unit of the plurality of blocks.

According to an embodiment, the timing controller further includes a first compensator for generating first data by applying an optical measurement result of the display panel and a gamma value corresponding to a position of the display panel to the input data.

According to an embodiment, the second compensator generates the output data by applying the first weight, the second weight, and the third weight to the first data in the unit of the plurality of blocks.

According to an embodiment of the disclosure, a display device includes a data driver, a timing controller, a first temperature sensor, a second temperature sensor, and a storage. The data driver is mounted on a first printed circuit board, and is configured to generate a data signal using output data. The timing controller is mounted on a second printed circuit board and is configured to correct input data to generate the output data. The first temperature sensor is mounted on the first printed circuit board. The second temperature sensor is mounted on the second printed circuit board. The storage has a plurality of temperature tables storing temperature information of a display unit corresponding to an attachment position of the second printed circuit board. The timing controller determines a temperature of the display unit using a temperature table of the plurality of temperature tables in response to a measurement result of the first temperature sensor and the second temperature sensor, and corrects the input data in response to the temperature of the display unit to generate the output data.

According to an embodiment, the timing controller corrects the input data to generate the output data so that an image of a uniform luminance is displayed regardless of the temperature of the display unit.

According to an embodiment, the timing controller selects the temperature table of the plurality of temperature tables using a difference value between a first temperature measured from the first temperature sensor and a second temperature measured from the second temperature sensor.

According to an embodiment of the disclosure, a method of driving a display device includes receiving a first temperature from a first temperature sensor mounted on a first printed circuit board including a data driver. A second temperature is received from a second temperature sensor mounted on a second printed circuit board including a timing controller. An attachment position of the second printed circuit board in a display unit is determined using the first temperature and the second temperature. A temperature of the display unit is determined in response to the attachment position of the second printed circuit board. Data supplied from the timing controller to the data driver is corrected in response to the temperature of the display unit.

According to an embodiment, the method further includes dividing the display unit into a plurality of blocks and storing the temperature of the display unit when attached to the second printed circuit board in each of the blocks as a plurality of temperature tables.

According to an embodiment, in determining the attachment position of the second printed circuit board, a temperature table of the plurality of temperature tables is selected using the first temperature and the second temperature.

According to an embodiment, the temperature table of the plurality of temperature tables is selected in response to a difference value between the first temperature and the second temperature.

According to an embodiment, the correcting the data includes correcting the data so that an image of a uniform luminance is displayed regardless of the temperature of the display unit.

According to an embodiment, the display unit includes a first color pixel generating light of a first color and a second color pixel generating light of a second color different from the first color. The method further includes storing first weights of the first color pixel and second weights of the second color pixel corresponding to a plurality of temperatures.

According to an embodiment, the correcting the data includes correcting the data using the first weights and the second weights.

In accordance with the display device and the method of driving the same according to embodiments of the disclosure, a position of a printed circuit board to which a timing controller is attached may be determined in response to a temperature from a temperature sensor. Thus, the temperature of the display unit corresponding to the position of the printed circuit board may be determined. In addition, an image of a uniform luminance may be displayed on the display unit by compensating for data in response to the temperature of the display unit.

However, an effect of the disclosure is not limited to the above-described effect, and may be variously expanded without departing from the spirit and scope of the disclosure.

BRIEF DESCRIPTION OF THE DRAWINGS

The above and other features of the disclosure will become more apparent by describing in further detail embodiments thereof with reference to the accompanying drawings.

DETAILED DESCRIPTION OF THE EMBODIMENT

Figure 1:
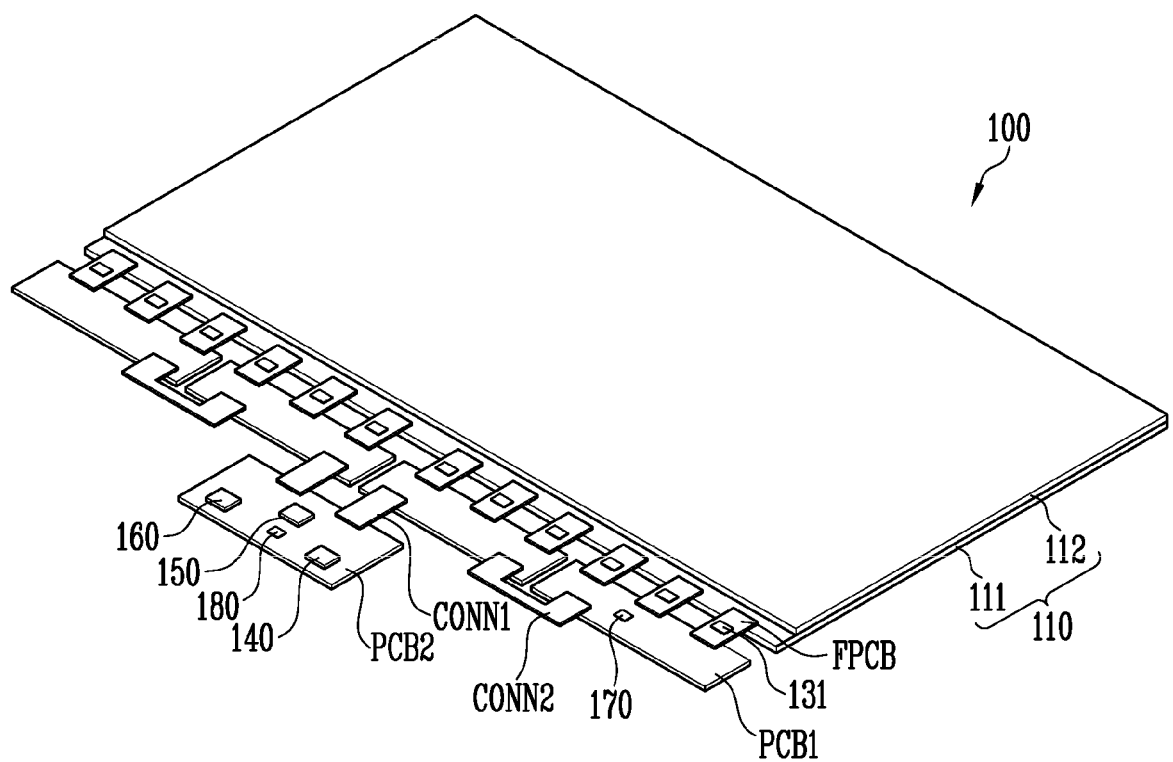
FIGS. 1 and 2 are diagrams illustrating a display device according to an embodiment of the disclosure.

Hereinafter, various embodiments of the disclosure will be described in detail with reference to the accompanying drawings so that those skilled in the art may easily carry out the disclosure. The disclosure may be implemented in various different forms and is not limited to the embodiments described herein.

In order to clearly describe the disclosure, parts that are not related to the description are omitted, and the same or similar components are denoted by the same reference numerals throughout the specification. Therefore, the above-described reference numerals may be used in other drawings.

In addition, sizes and thicknesses of each component shown in the drawings are arbitrarily shown for convenience of description, and thus the disclosure is not necessarily limited to those shown in the drawings. In the drawings, thicknesses may be exaggerated to clearly express various layers and areas.

In addition, an expression "is the same" in the description may mean "is substantially the same". That is, the expression "is the same" may be the same enough for those of ordinary skill to understand that it is the same. Other expressions may also be expressions in which "substantially" is omitted.

Figure 2:
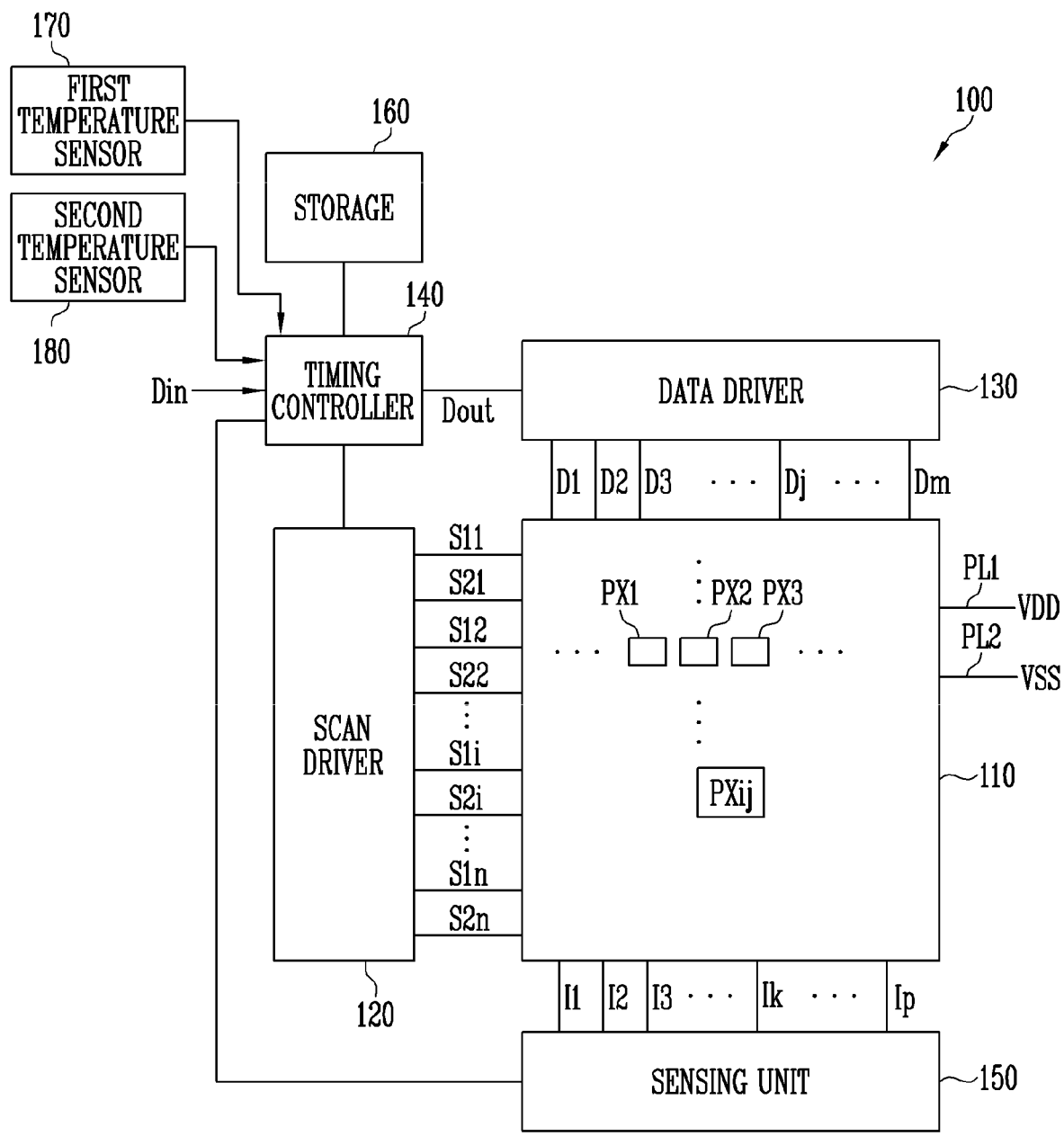

FIGS. 1 and 2 are diagrams illustrating a display device 100 according to an embodiment of the disclosure. FIG. 1 shows a perspective view of the display device 100. FIG. 2 shows a block diagram of the display device 100.

Referring to FIGS. 1 and 2, the display device 100 may include a display unit 110 (or a display panel), a scan driver 120, a data driver 130, a timing controller 140, a sensing unit 150, a storage 160 (or a memory), a first temperature sensor 170, and a second temperature sensor 180. The scan driver 120, the data driver 130, the timing controller 140, the sensing unit 150, the storage 160, the first temperature sensor 170, and the second temperature sensor 180 may configure a driving device driving the display unit 110.

The display unit 110 may display an image. The display unit 110 may be an organic light emitting display panel, a liquid crystal display panel, an electrophoretic display panel, or an inorganic light emitting display panel.

As shown in FIG. 1, the display unit 110 may include a lower substrate 111 and an upper substrate 112. The lower substrate 111 may be a thin film transistor substrate formed of plastic or glass. The upper substrate 112 may be an encapsulation substrate formed of a plastic film, an organic substrate, or a protective film.

The display unit 110 may include scan lines S11 to S1n and S21 to S2n, sensing lines I1 to Ip, data lines D1 to Dm, a first power line PL1, a second power line PL2, and pixels PX, where each of n, m, and p is a natural number.

The pixels PX may be disposed in an area partitioned by the scan lines S11 to S1n and S21 to S2n and the data lines D1 to Dm. Each of the pixels PX may be connected to any one of the scan lines S11 to S1n and S21 to S2n and any one of the data lines D1 to Dm. For example, a pixel PXij positioned in an i-th row and a j-th column may be connected to an i-th first scan line S1i, an i-th second scan line S2i, a j-th data line Dj, and a k-th sensing line Ik (where, each of i, j, and k is a natural number).

In addition, each of the pixels PX may be electrically connected between the first power line PL1 and the second power line PL2. A voltage of first power VDD may be applied to the first power line PL1, and a voltage of second power VSS may be applied to the second power line PL2. The first power VDD and the second power VSS may be power voltages or driving voltages required for an operation of the pixels PX, and the first power VDD may have a voltage level higher than that of the second power VSS.

During a display period, the pixel PXij may be selected by a first scan signal supplied to the first scan line S1i, and may receive a data signal from the data line Dj. In addition, the pixel PXij may receive a voltage of initialization power (not shown) in response to a second scan signal supplied to the second scan line S2i. Thereafter, the pixel PXij may supply light of a luminance corresponding to the data signal to an outside.

The pixels PX may include first pixels PX1 emitting light of a first color, second pixels PX2 emitting light of a second color, and third pixels PX3 emitting light of a third color. The first, second, and third pixels PX1, PX2, PX3 are sometimes called the first, second, and third color pixels PX1, PX2, PX3, respectively. Here, the first color, the second color, and the third color may be different colors. For example, the first color may be red, the second color may be green, and the third color may be blue. In an embodiment, the first color may be magenta, the second color may be cyan, and the third color may be yellow.

The scan driver 120 may generate scan signal, e.g., the first scan signal and the second scan signal, in response to a control signal from the timing controller 140, and supply the scan signal to the scan lines S11 to S1n and S21 to S2n. For example, the timing controller 140 may supply the control signal such as a start pulse and a clock signal to the scan driver 120. The scan driver 120 may be implemented as a shift register that sequentially generates and outputs a pulse shape of scan signal by sequentially shifting a pulse shape of start pulse using a clock signal.

The scan driver 120 may be formed together with the pixels PX on the display unit 110. However, in an embodiment, the scan driver 120 may be mounted on a circuit film and connected to the timing controller 140 via at least one circuit film and a printed circuit board.

Meanwhile, in FIG. 2, one scan driver 120 drives the first scan lines S11 to S1n and the second scan lines S21 to S2n. However, in an embodiment, each of the first scan lines S11 to S1n and the second scan lines S21 to S2n may receive a scan signal from different scan drivers.

The sensing unit 150 may supply the voltage of the initialization power to the sensing lines I1 to Ip during at least a partial period of the display period and a sensing period. In addition, the sensing unit 150 may receive a sensing voltage from the pixels PX connected to the sensing lines I1 to Ip during a remaining period of the sensing period. The sensing voltage may include mobility and a threshold voltage of a driving transistor included in each of the pixels PX, and/or deterioration information of a light emitting element.

The data driver 130 may receive output data Dout and control signals from the timing controller 140. The data driver 130 receiving the control signals may generate a data signal (or a data voltage) of an analog format using output data Dout of a digital format and supply the data signal to the data lines D1 to Dm. The data driver 130 may supply the data signal in a pixel row (or horizontal line) unit. Here, a pixel row may refer to a row in which pixels connected to the same scan line are disposed. Additionally, the data driver 130 may supply a reference voltage to the data lines D1 to Dm during the sensing period.

Figure 5:
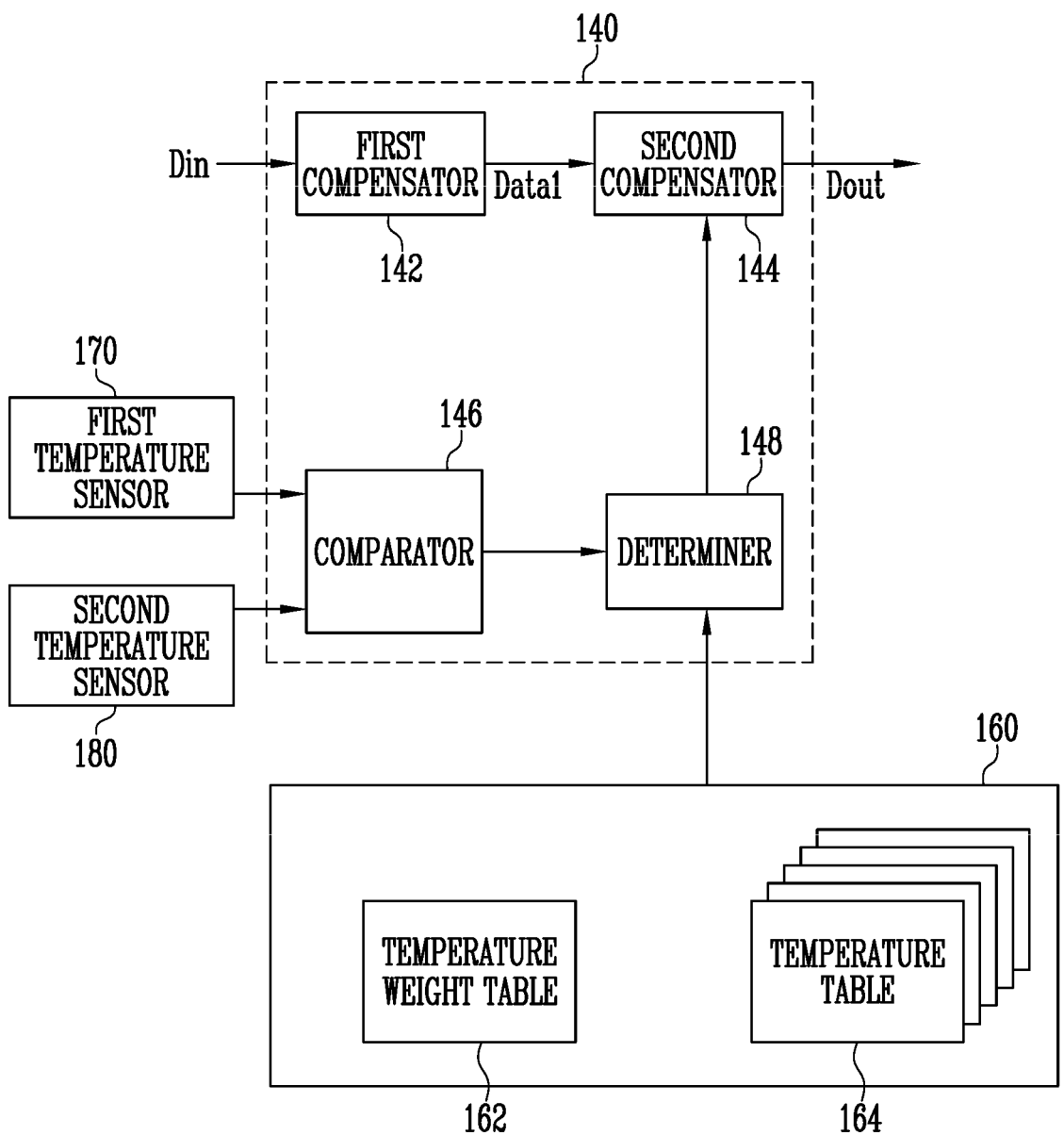
FIG. 5 is a diagram illustrating a timing controller and a storage according to an embodiment of the disclosure.

The storage 160 may store a temperature weight table 162 and temperature tables 164 as shown in FIG. 5. A detailed description in relation to this is described later.

The timing controller 140 may receive input data Din and a timing control signal from an external device, for example, a graphics processor, and generate a control signal to be supplied to the scan driver 120, the data driver 130, and the sensing unit 150 based on the timing control signal. In addition, the timing controller 140 may generate the output data Dout by converting the input data Din. For example, the timing controller 140 may generate the output data Dout by correcting the input data Din in response to a temperature of the display unit 110 and an optical measurement result of the display unit 110. A detailed description in relation to this is described later.

As shown in FIG. 1, the data driver 130 may include a plurality of data integrated circuits (ICs) 131 (or source driver ICs). The data IC 131 may be mounted on a flexible circuit board FPCB and may be connected to the timing controller 140 via at least one printed circuit board PCB1 or PCB2 and/or at least one cable CONN1 or CONN2.

In an embodiment, the data IC 131 may be mounted on the flexible circuit board FPCB, and one side of the flexible circuit board FPCB may be electrically connected to pads (not shown) positioned on the display unit 110. Here, the pads may be electrically connected to the data lines D1 to Dm, and thus the data IC 131 may be electrically connected to the data lines D1 to Dm.

The timing controller 140, the sensing unit 150, and the storage 160 may be mounted on the second printed circuit board PCB2. The second printed circuit board PCB2 may be electrically connected to the first printed circuit board PCB1 through the first cables CONN1. In addition, each of the first printed circuit boards PCB1 may be electrically connected via the second cables CONN2. In this case, the timing controller 140 may be electrically connected to the data IC 131 via the first printed circuit board PCB1, the first cables CONN1, and the second cables CONN2.

The flexible printed circuit board FPCB may be disposed in a curved shape to face a rear surface of the display unit 110, and thus the first printed circuit board PCB1 and the second printed circuit board PCB2 may be attached (or fixed) to the rear surface of the display unit 110. In this case, the first printed circuit board PCB1 and the second printed circuit board PCB2 may not be visually recognized from the outside.

The first temperature sensor 170 may be mounted on the first printed circuit board PCB1. The first temperature sensor 170 may measure a temperature of a position where the first printed circuit board PCB1 is attached and provide the temperature to the timing controller 140. For example, the first temperature sensor 170 may measure a temperature of a lower right end of the display unit 110 and provide the temperature to the timing controller 140.

In FIG. 1, one first temperature sensor 170 is disposed on one side, for example, a right side, of the first printed circuit board PCB1. However, in an embodiment, a plurality of first temperature sensors 170 may be attached to the first printed circuit board PCB1 to measure a temperature of a lower end of the display unit 110. In an embodiment, the first temperature sensor 170 may be disposed on another side, for example, a left side, of the first printed circuit board PCB1.

The second temperature sensor 180 may be mounted on the second printed circuit board PCB2. The second temperature sensor 180 may measure a temperature of a position where the second printed circuit board PCB2 is attached and provide the temperature to the timing controller 140. When the second printed circuit board PCB2 is positioned as shown in FIG. 1, the second temperature sensor 180 may measure a temperature of a lower area of a central portion of the display unit 110 and provide the temperature to the timing controller 140.

Meanwhile, the second printed circuit board PCB2 may be attached to various positions in a finished product manufacturer (or a set company) after the display unit 110 is shipped. In this case, a luminance non-uniformity phenomenon due to temperature heating may occur in correspondence with an attachment position of the second printed circuit board PCB2.

Figures 3A, 3B:
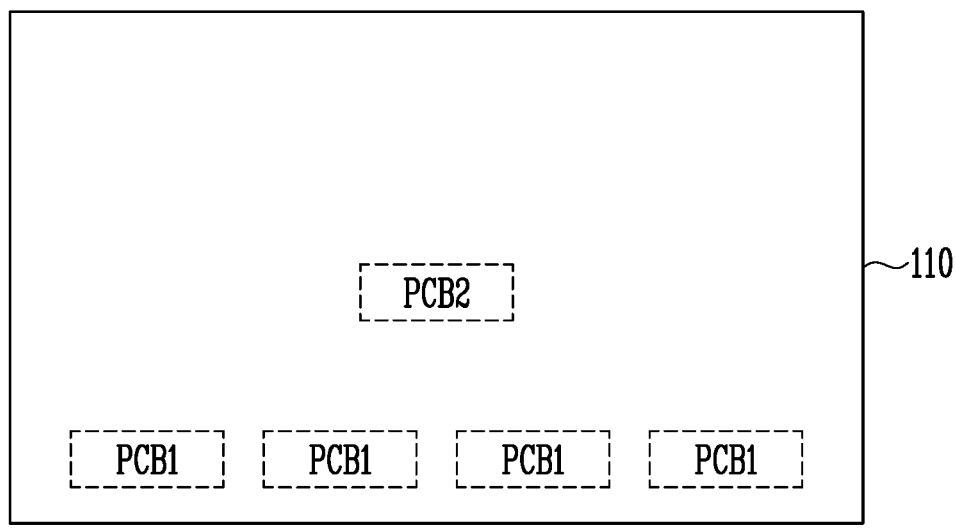
FIGS. 3A and 3B are diagrams illustrating a temperature of a display unit corresponding to an attachment position of a printed circuit board.

FIGS. 3A and 3B are diagrams illustrating a temperature of a display unit corresponding to an attachment position of a printed circuit board.

Referring to FIGS. 3A and 3B, when the printed circuit boards PCB1 and PCB2 of FIG. 1 are attached to the rear surface of the display unit 110, the first printed circuit boards PCB1 may be positioned at a lower end portion of the display unit 110, and the second printed circuit board PCB2 may be positioned at a lower side of the central portion of the display unit 110.

At this time, when measuring a temperature of a panel, different temperatures may appear according to the position of the display unit 110. For example, when the display unit 110 is divided into a plurality of blocks BLK11, BLK12, BLK13, BLK21, BLK22, BLK23, BLK31, BLK32, BLK33, different temperatures may be measured for each of the blocks BLK11 to BLK33.

For example, a high temperature may be measured in the blocks BLK22, BLK31, BLK32, and BLK33 adjacent to an area where the first printed circuit board PCB1 and the second printed circuit board PCB2 are attached, and a relatively low temperature may be measured in the blocks BLK11, BLK12, and BLK13 positioned apart from the area where the first printed circuit board PCB1 and the second printed circuit board PCB2 are attached.

As described above, when the temperature of the display unit 110 is different for each position, a luminance may be different in each of the blocks BLK11 to BLK33 even though the same data signal is supplied. That is, when the temperature of the display unit 110 is different for each position, a non-uniform image may be displayed on the display unit 110.

Meanwhile, the position where the first printed circuit board PCB1 is attached may be set identically regardless of the set company, and the position where the second printed circuit board PCB2 is attached may be different for each set company.

In an embodiment of the disclosure, a method capable of determining the attachment position of the second printed circuit board PCB2 and a temperature distribution of the display unit 110 corresponding to the attachment position using a temperature measurement result of the first temperature sensor 170 and the second temperature sensor 180, and compensating for data in response to the determination is presented.

Figure 4:
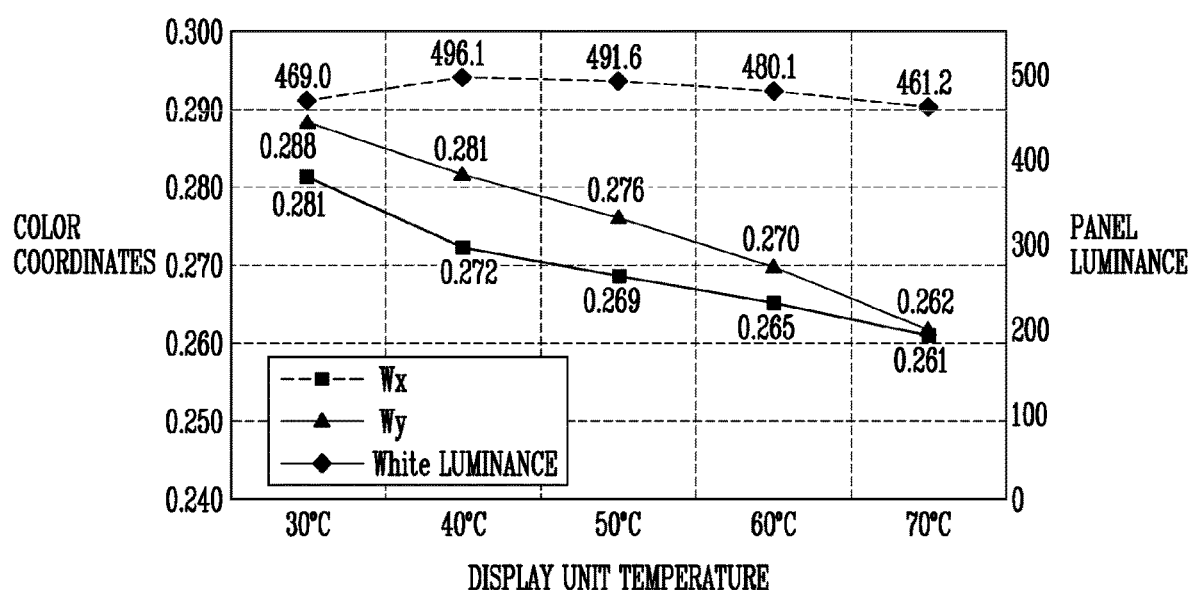
FIG. 4 is a diagram illustrating a color coordinate corresponding to the temperature of the display unit.

FIG. 4 is a diagram illustrating a color coordinate corresponding to the temperature of the display unit 110. In FIG. 4, a horizontal axis represents the temperature of the display unit 110, and a left vertical axis represents white color coordinates (Wx, Wy). In FIG. 4, a right vertical axis represents a panel luminance.

Referring to FIG. 4, when the temperature of the display unit 110 increases, the white color coordinates (Wx, Wy) are changed. When the white color coordinates (Wx, Wy) are changed in response to the temperature increase of the display unit 110, a color matching rate may decrease. For example, the color matching rate may be set to 94.6% when the temperature of the display unit 110 is 30° C., and the color matching rate may be set to 93.2% when the temperature of the display unit 110 is 70° C. That is, when the temperature of the display unit 110 increases from 30° C. to 70° C., the color matching rate may decrease by 1.4%.

In addition, when the temperature of the display unit 110 increases from 30° C. to 60° C., the white luminance of the display unit 110 increases, and when the temperature increases from 60° C. to 70° C., the white luminance of the display unit 110 decreases. That is, the white luminance changes in response to the temperature of the display unit 110.

An embodiment of the disclosure presents a method of compensating for data so that the color coordinates and the white luminance may be maintained in response to the temperature increase of the display unit 110. For example, when temperatures of the blocks BLK11 to BLK33 included in the display unit 110 are accurately determined, data may be compensated to control the white color coordinates (Wx, Wy) to be changed within 0.003 regardless of the temperature increase of the display unit 110.

Figure 6:
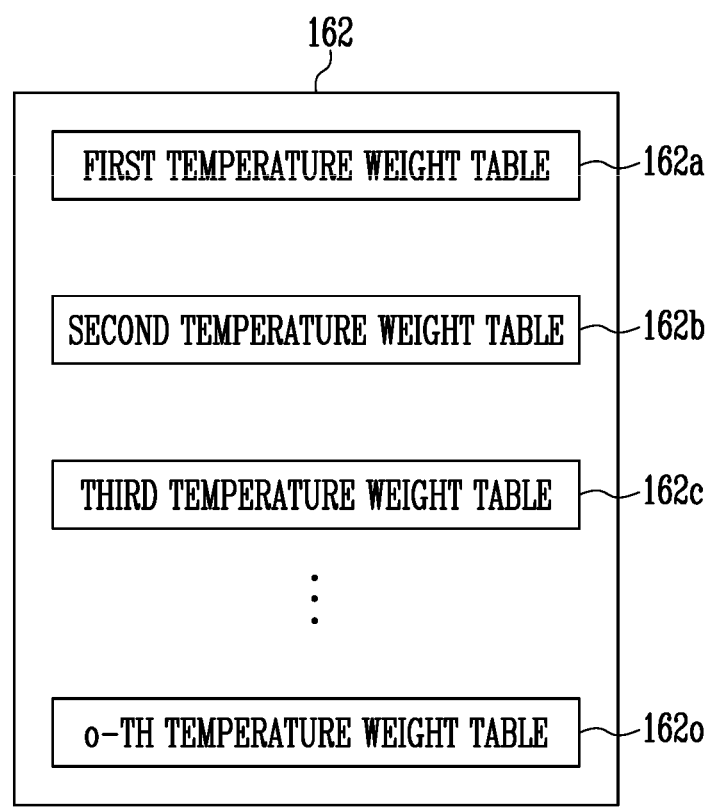
FIG. 6 is a diagram illustrating an embodiment of a temperature weight table shown in FIG. 5.

FIG. 5 is a diagram illustrating the timing controller 140 and the storage 160 according to an embodiment of the disclosure. FIG. 6 is a diagram illustrating an embodiment of the temperature weight table 162 shown in FIG. 5. FIGS. 7A to 7D are diagrams illustrating a method of generating the temperature tables 164 shown in FIG. 5. FIG. 8 is a diagram illustrating an embodiment of temperature weight information for each block applied in a determiner 148 of FIG. 5.

Referring to FIG. 5, the temperature weight table 162 and the plurality of temperature tables 164 may be stored in the storage 160 according to an embodiment of the disclosure.

The temperature weight table 162 may store a weight corresponding to the temperature of the display unit 110. For example, in the temperature weight table 162, as shown in FIG. 6, a first temperature weight table 162*a* corresponding to a first temperature, for example, 30° C., a second temperature weight table 162*b* corresponding to a second temperature, for example, 35° C., a third temperature weight table 162*c* corresponding to a third temperature, for example, 40° C., and an o-th, for example, "o" is a natural number equal to or greater than 4, weight temperature 162*o* corresponding to an o-th temperature, for example, 90° C., may be stored.

In an embodiment, a partial area of the display unit 110 may be set to the first temperature, and a remaining area may be set to the second temperature. At this time, the timing controller 140 may apply a weight of the first temperature weight table 162*a* to first data Data1 to be supplied to the partial area of the display unit 110 and apply a weight of the second temperature weight table 162*b* to the first data Data1 to be supplied to the remaining area of the display unit 110.

In this case, the first data Data1 to be supplied to the display unit 110 may receive a weight corresponding to the temperature of the display unit 110, and thus an image of a uniform luminance may be displayed on the display unit 110. To this end, the weights included in each of the temperature weight tables 162*a* to 162*o* may be experimentally set in advance so that an image of a uniform luminance may be displayed on the display unit 110.

Meanwhile, in each of the temperature weight tables 162*a* to 162*o*, a first weight corresponding to the first color pixel PX1, a second weight corresponding to the second color pixel PX2, and a third weight corresponding to the third color pixel PX3 may be included. The first weight may be applied to the first data Data1 to be supplied to the first color pixel PX1, the second weight may be applied to the first data Data1 to be supplied to the second color pixel PX2, and the third weight may be applied to the first data Data1 to be supplied to the third color pixel PX3. In an embodiment, since ratios of the first color, the second color, and the third color included in the white luminance are different, the color matching rate and the luminance may be maintained by applying different weights to respective data to be supplied to the first color pixel PX1, the second color pixel PX2, and the third color pixel PX3.

The plurality of temperature tables 164 may respectively store the temperature of the display unit 110 corresponding to the position of the second printed circuit board PCB2. For example, the second printed circuit board PCB2 may be positioned to be attached to any one of the blocks BLK11 to BLK33 as shown in FIGS. 7A to 7D.

Figure 7A:
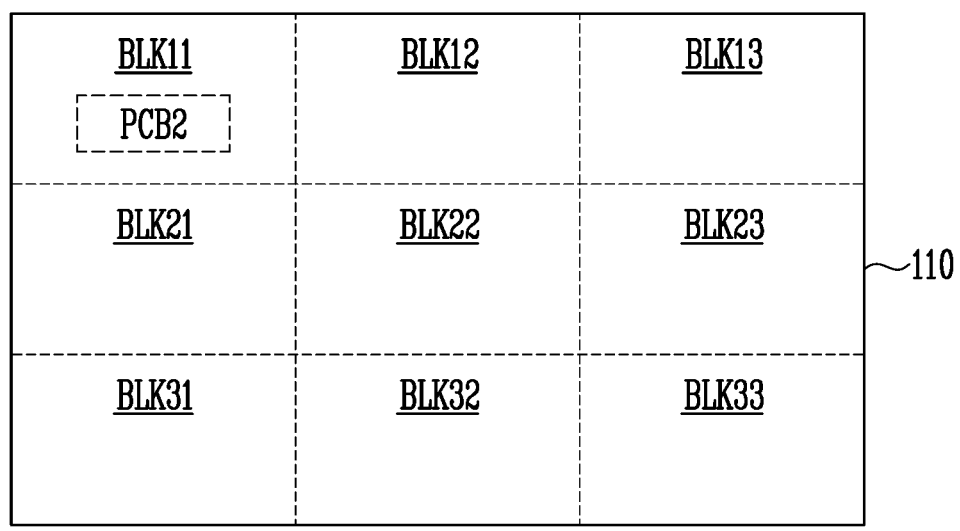
FIGS. 7A, 7B, 7C, and 7D are diagrams illustrating a method of generating a temperature table shown in FIG. 5.
Figures 8, 9:
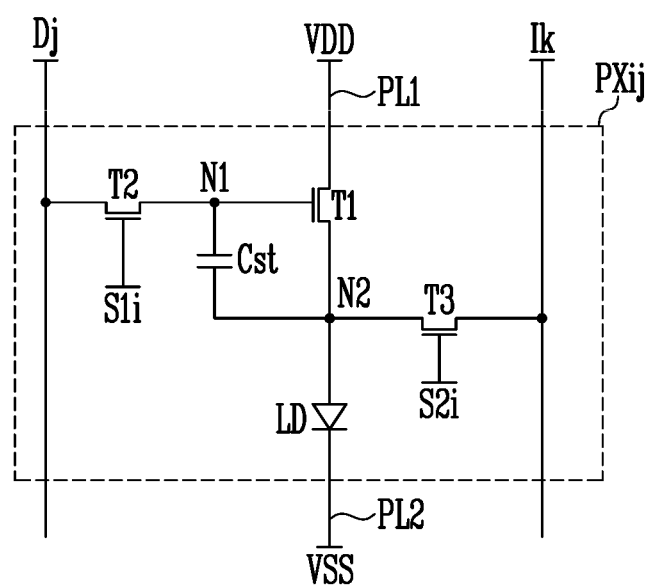
FIG. 8 is a diagram illustrating an embodiment of temperature weight information for each block applied in a determiner of FIG. 5.
FIG. 9 is a diagram illustrating an embodiment of a pixel shown in FIG. 2.

In an embodiment, as shown in FIG. 7A, when the second printed circuit board PCB2 is attached to a first block BLK11, the temperature of each of the blocks BLK11 to BLK33 of the display unit 110 may be stored as a first temperature table. Additionally, the temperature of the remaining blocks BLK12 to BLK33 may be stored in the first temperature table in response to various temperatures, for example, the first to o-th temperatures, of the first block BLK11. To this end, the first temperature table may be generated while changing a driving temperature of the display unit 110 after attaching the second printed circuit board PCB2 to a rear surface of the first block BLK11 of the display unit 110 during a process, and the generated first temperature table may be stored in the storage 160.

Figure 7B:
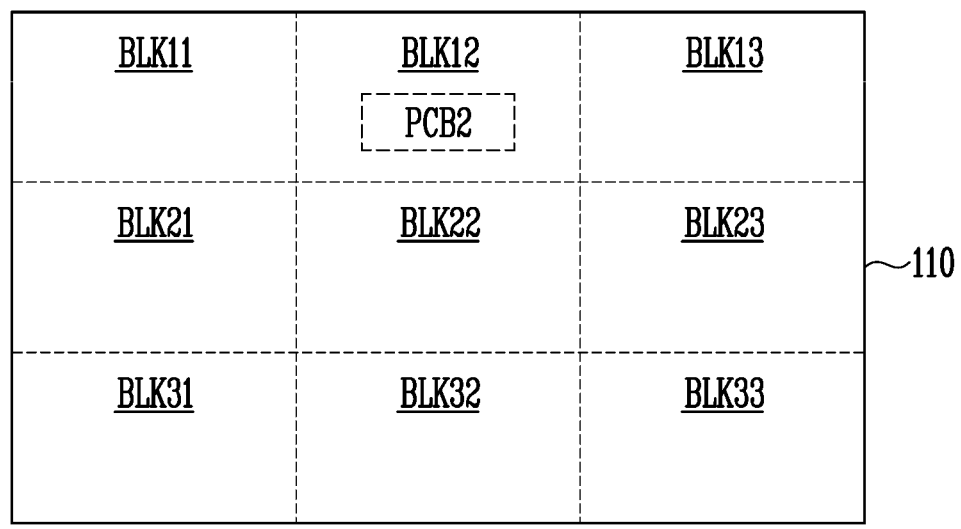

In an embodiment, as shown in FIG. 7B, when the second printed circuit board PCB2 is attached to a second block BLK12, the temperature of each of the blocks BLK11 to BLK33 of the display unit 110 may be stored as a second temperature table. Additionally, the temperature of the remaining blocks BLK11 and BLK13 to BLK33 may be stored in the second temperature table in response to various temperatures, for example, the first to o-th temperatures, of the second block BLK12.

Figure 7C:
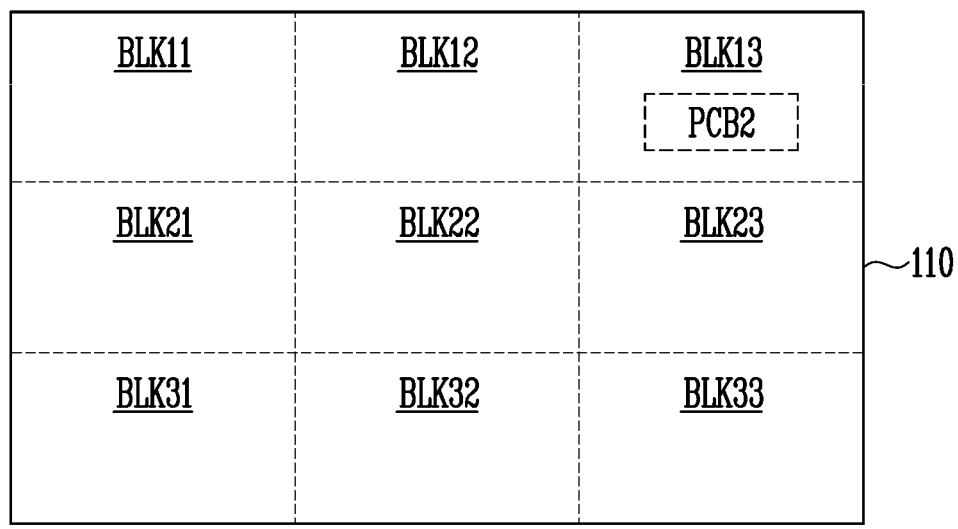

In an embodiment, as shown in FIG. 7C, when the second printed circuit board PCB2 is attached to a third block BLK13, the temperature of each of the blocks BLK11 to BLK33 of the display unit 110 may be stored as a third temperature table. Additionally, the temperature of the remaining blocks BLK11, BLK12, and BLK21 to BLK33 may be stored in the third temperature table in response to various temperatures, for example, the first to o-th temperatures, of the third block BLK13.

Figure 7D:
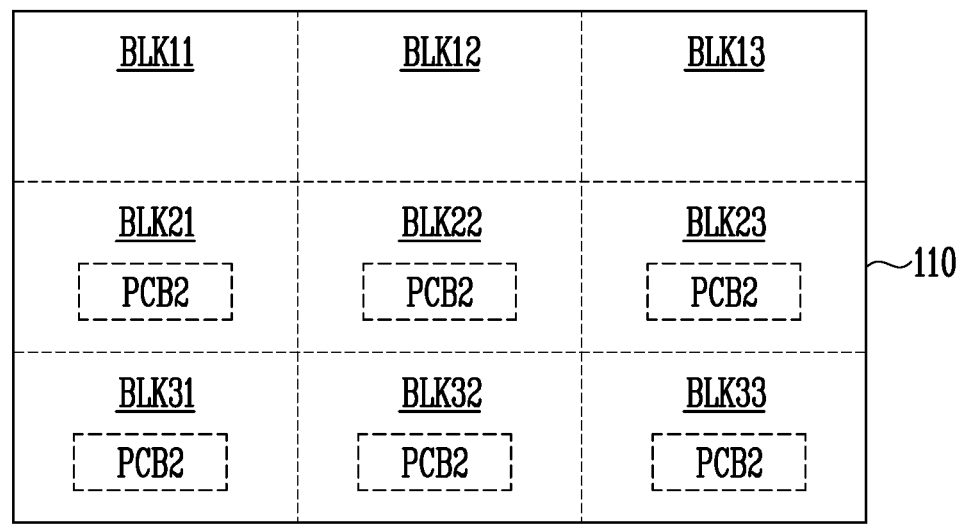

In fact, in an embodiment of the disclosure, fourth to ninth temperature tables corresponding to the remaining blocks BLK21 to BLK33 may be stored in the storage 160 while repeating the above-described process as shown in FIG. 7D.

In this case, the plurality of temperature tables 164 included in the storage 160 may include temperature information of the display unit 110 corresponding to the attachment position of the second printed circuit board PCB2.

Meanwhile, in the above description, the display unit 110 includes the nine blocks BLK11 to BLK33. However, in an embodiment, the number of blocks included in the display unit 110 may be variously set to at least two or more.

The timing controller 140 according to an embodiment of the disclosure includes a first compensator 142, a second compensator 144, a comparator 146, and a determiner 148.

The first compensator 142 may generate the first data Data1 by correcting the input data Din. For example, the first compensator 142 may correct the input data Din using optical measurement information of the display unit 110 measured during the process.

In addition, the first compensator 142 may generate the first data Data1 by correcting the input data Din using different gamma tables corresponding to the position of the display unit 110. The gamma table may be set in advance so that a uniform luminance is displayed in response to the position of the display unit 110.

The comparator 146 may receive the first temperature of the display unit 110 from the first temperature sensor 170 and receive the second temperature of the display unit 110 from the second temperature sensor 180. Here, the first temperature means the temperature of the display unit 110 in the area where the first printed circuit board PCB1 is positioned, and the second temperature means the temperature of the display unit 110 in the area where the second printed circuit board PCB2 is positioned. The comparator 146 receiving the first temperature and the second temperature supplies a difference value between the first temperature and the second temperature to the determiner 148.

The determiner 148 may receive the first temperature, the second temperature, and the difference value between the first temperature and the second temperature, and determine the attachment position of the second printed circuit board PCB2 using the first temperature, the second temperature and/or the difference value.

More specifically, the position of the first temperature sensor 170 may be fixed to the same position in all display devices 100, and the position of the second temperature sensor 180 may be changed for each display device 100 in response to the position of the second printed circuit board PCB2. Here, temperature information of the first temperature sensor 170 may be previously stored in the storage 160 as the temperature table.

The determiner 148 may select a specific temperature table corresponding to the difference value between the first temperature and the second temperature among the plurality of temperature tables 164. Here, the specific temperature table may correspond to the attachment position of the second printed circuit board PCB2. For example, in FIG. 7A, when the second printed circuit board PCB2 is attached to the first block BLK11, the difference value between the first temperature and the second temperature may be set to a first value. The determiner 148 may determine the temperature distribution of the display unit 110 corresponding to the attachment position of the second printed circuit board PCB2 by selecting a specific temperature table in which the difference value between the first temperature and the second temperature is set as the first value.

The determiner 148 may determine the temperature of each of the blocks BLK11 to BLK33 of each display unit 110 in response to the specific temperature table. Thereafter, the determiner 148 may set temperature weight for each of the blocks BLK11 to BLK33 in response to the temperature of each of the blocks BLK11 to BLK33 as shown in FIG. 8. The temperature weights for each of the blocks BLK11 to BLK33 set by the determiner 148 may be supplied to the second compensator 144.

The second compensator 144 may generate the output data Dout by compensating for the first data Data1 for each of the blocks BLK11 to BLK33 of the display unit 110 using the temperature weight of each of the blocks BLK11 to BLK33 supplied from the determiner 148. The output data Dout generated by the second compensator 144 is supplied to the data driver 130, and the data driver 130 displays a predetermined image on the display unit 110 using the output data Dout. Here, the image displayed on the display unit 110 may correspond to the output data Dout reflecting the temperature of each of the blocks BLK11 to BLK33 of the display unit 110, and thus an image of a uniform luminance may be displayed on the display unit 110.

For example, the second compensator 144 may generate the output data Dout as shown in Equation 1.

Total $W$=Temp_Weight $R$+Temp_Weight $G$+Temp_Weight $B$     [Equation 1]

Comp_$R$($D$out)=Data1($R$)×(Temp_Weight $R$/Total $W$)

Comp_$G$($D$out)=Data1($G$)×(Temp_Weight $G$/Total $W$)

Comp_$B$($D$out)=Data1($B$)×(Temp_Weight $B$/Total $W$)

In Equation 1, Total W means a sum of weights of the first color, for example, red (R), the second color, for example, green (G), and the third color, for example, blue (B) at each temperature.

In Equation 1, the output data (Comp_R(Dout), Comp_G(Dout), and Comp_B(Dout)) may be generated by multiplying a ratio occupied by a weight of a specific color by first data (Data1(R), Data1(G), and Data1(B). However, in an embodiment, the second compensator 144 may generate the output data Dout using various methods so that the luminance and/or the color coordinates may be compensated in response to the temperature of the display unit 110.

Meanwhile, in FIG. 8, different temperature weights are set for each of the blocks BLK11 to BLK33. However, in an embodiment, when many blocks are included in the display unit 110, the temperature weight may be set in a unit of at least two or more blocks by summing an average temperature of at least two or more blocks.

FIG. 9 is a diagram illustrating an embodiment of the pixel PXij shown in FIG. 2. In FIG. 9, the pixel PXij positioned on an i-th horizontal line and a j-th vertical line is shown. In the first pixel PX1, the second pixel PX2, and the third pixel PX3, types of light emitted from a light emitting element LD may be different, but circuit configurations of the first pixel PX1, the second pixel PX2, and the third pixel PX3 may be the same or similar to the pixel PXij as shown in FIG. 9.

Referring to FIG. 9, the pixel PXij according to an embodiment of the disclosure may include transistors T1 to T3, a storage capacitor Cst, and the light emitting element LD.

The light emitting element LD may be connected between the first power line PL1 to which the first power VDD is supplied and the second power line PL2 to which the second power VSS is supplied. For example, a first electrode, for example, an anode electrode, of the light emitting element LD may be connected to the first power line PL1 via a second node N2 and the first transistor T1, and a second electrode, for example, a cathode electrode, of the light emitting element LD may be connected to the second power line PL2. The light emitting element LD may emit light with a luminance corresponding to a driving current supplied from the first transistor T1.

A voltage of the first power VDD and a voltage of the second power VSS may have a predetermined potential difference so that the light emitting element LD emits light. For example, the first power VDD may be high potential power having a high voltage, and the second power VSS may be low potential power having a voltage lower than that of the first power VDD.

The light emitting element LD may be selected as an organic light emitting element (organic light emitting diode). In addition, the light emitting element LD may be selected as an inorganic light emitting element (inorganic light emitting diode) such as a micro light emitting diode (LED) or a quantum dot light emitting element (quantum dot light emitting diode). In addition, the light emitting element LD may be an element in which an organic material and an inorganic material are combined. In FIG. 9, the pixel PXij includes a single light emitting element LD, but in an embodiment, the pixel PXij may include a plurality of light emitting elements, and the plurality of light emitting elements may be connected in series, in parallel, or in series-parallel with each other.

The transistors T1, T2, and T3 may be configured as N-type transistors. In an embodiment, the transistors T1, T2, and T3 may be configured as P-type transistors. In an embodiment, the transistors T1, T2, and T3 may be configured as a combination of an N-type transistor and a P-type transistor. The P-type transistor collectively refers to a transistor that conducts and a current amount increases when a voltage difference between a gate electrode and a source electrode increases in a negative direction. The N-type transistor collectively refers to a transistor that conducts and a current amount increases when a voltage difference between a gate electrode and a source electrode increases in a positive direction.

The transistor may be configured in various forms, such as a thin film transistor (TFT), a field effect transistor (FET), and a bipolar junction transistor (BJT).

The first transistor T1 is connected between the first power line PL1 and the second node N2. In addition, a gate electrode of the first transistor T1 is connected to a first node N1. The first transistor T1 controls a current amount supplied from the first power VDD to the second power VSS via the light emitting element LD in response to a voltage of the first node N1. Such a first transistor T1 may be referred to as a driving transistor.

The second transistor T2 is connected between the data line Dj and the first node N1. In addition, a gate electrode of the second transistor T2 is connected to a first scan line S1i. The second transistor T2 is turned on when a first scan signal is supplied to the first scan line S1i to electrically connect the data line Dj and the first node N1.

The third transistor T3 is connected between the second node N2 and a sensing line Ik, where "k" is a natural number. In addition, a gate electrode of the third transistor T3 is connected to a second scan line S2i. The third transistor T3 is turned on when a second scan signal is supplied to the second scan line S2i to electrically connect the sensing line Ik and the second node N2.

The storage capacitor Cst is connected between the first node N1 and the second node N2. The storage capacitor Cst stores a voltage corresponding to a difference between the first node N1 and the second node N2.

Figure 10:
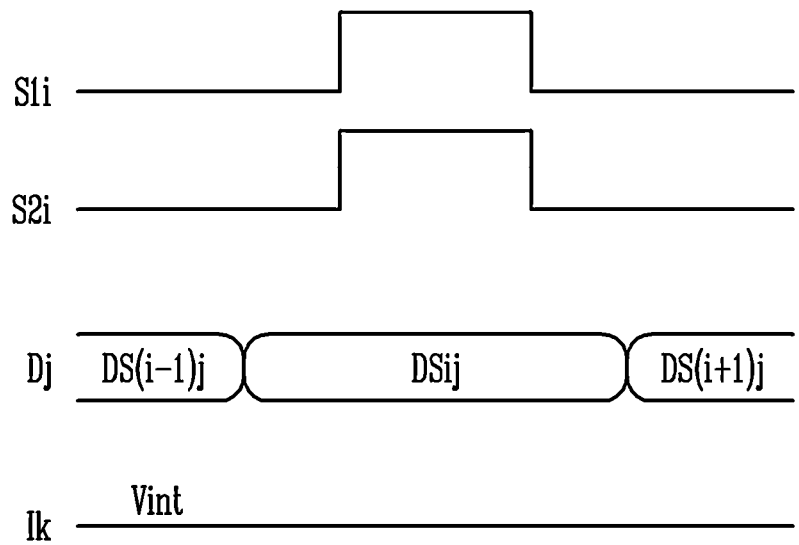
FIG. 10 is a waveform diagram illustrating a method of driving the pixel during a display period.

FIG. 10 is a waveform diagram illustrating a method of driving the pixel during the display period.

Referring to FIG. 10, during the display period, the voltage of the initialization power Vint is supplied to the sensing line Ik. During the display period, the first scan signal is supplied to the first scan line S1i and the second scan signal is supplied to the second scan line S2i.

When the first scan signal is supplied to the first scan line S1i, the second transistor T2 is turned on. When the second transistor T2 is turned on, a data signal DSij from the data line Dj is supplied to the first node N1. When the second scan signal is supplied to the second scan line S2i, the third transistor T3 is turned on. When the third transistor T3 is turned on, the voltage of the initialization power Vint from the sensing line Ik is supplied to the second node N2. At this time, a voltage corresponding to a voltage difference between a voltage of the data signal DSij and the voltage of the initialization power Vint is stored in the storage capacitor Cst.

After the voltage corresponding to the data signal DSij is stored in the storage capacitor Cst, the supply of the first scan signal to the first scan line S1i is stopped and thus the second transistor T2 is turned off, and the supply of the second scan signal to the second scan line S2i is stopped and thus the third transistor T3 is turned off. Thereafter, the first transistor T1 supplies a current corresponding to the voltage stored in the storage capacitor Cst to the light emitting element LD. A luminance of the light emitting element LD may be determined corresponding to an amount of the current supplied from the first transistor T1 to the light emitting element LD.

During the sensing period, the reference voltage may be supplied to the data line Dj, a current corresponding to the reference voltage may be supplied from the first transistor T1 to the second node N2, and thus the sensing voltage may be applied to the second node N2. During the sensing period, the third transistor T3 is set to a turn-on state, and thus the sensing voltage may be supplied to the sensing unit 150 via the sensing line Ik. The sensing unit 150 may determine the threshold voltage and mobility of the first transistor T1 and/or the deterioration information of the light emitting element LD using the sensing voltage. The timing controller 140 may correct the input data Din using the threshold voltage of the first transistor T1 and/or the deterioration information of the light emitting element LD determined by the sensing unit 150.

Figure 11:
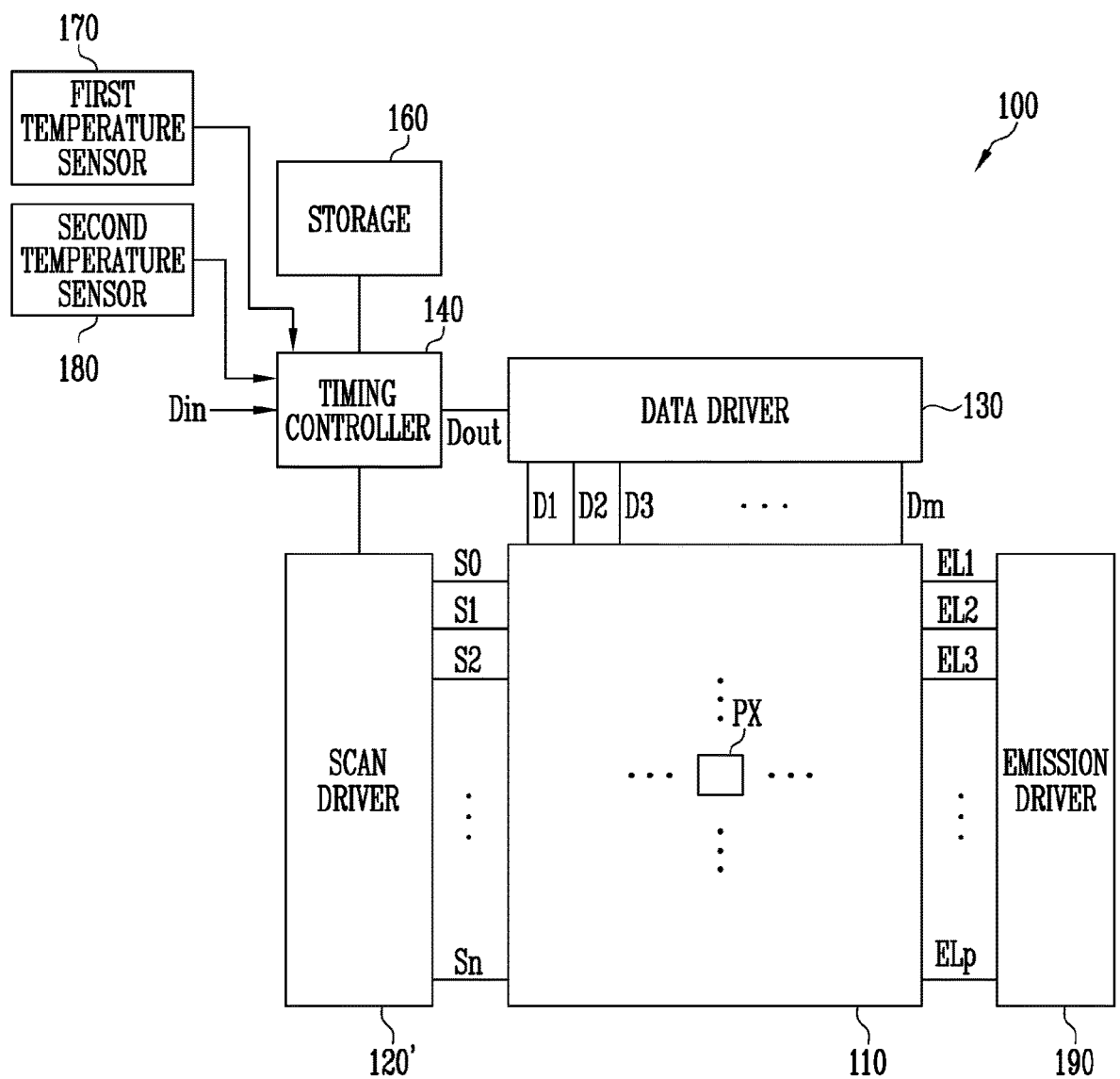
FIGS. 11, 12, and 13 are diagrams illustrating a display device including a pixel according to an embodiment of the disclosure.
Figure 12:
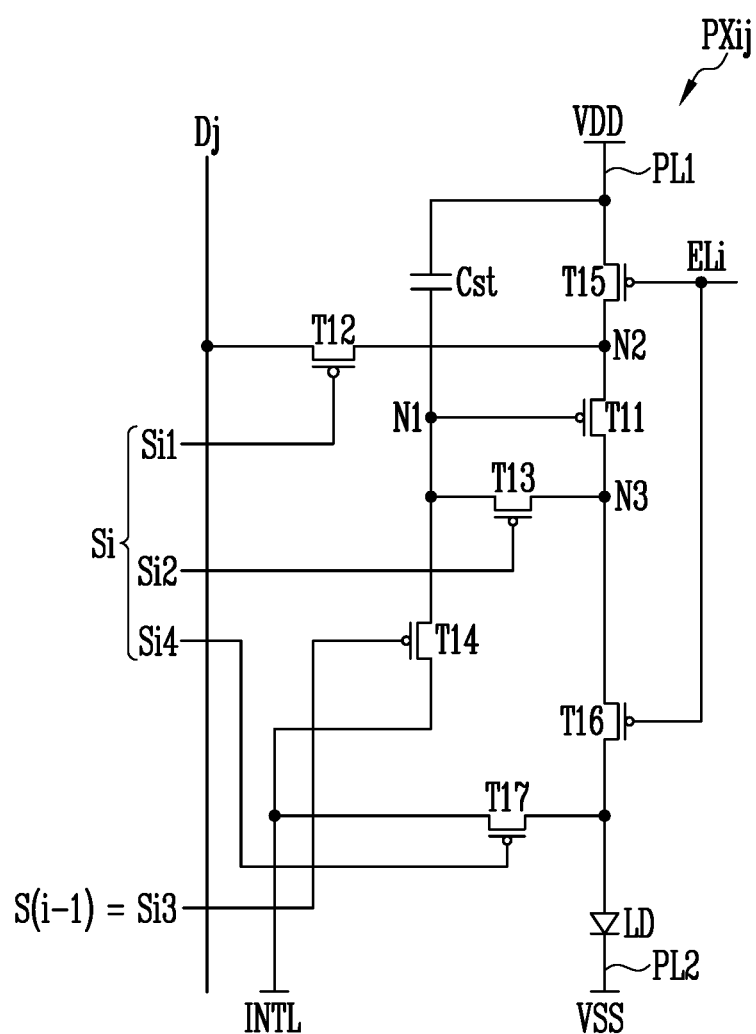
Figure 13:
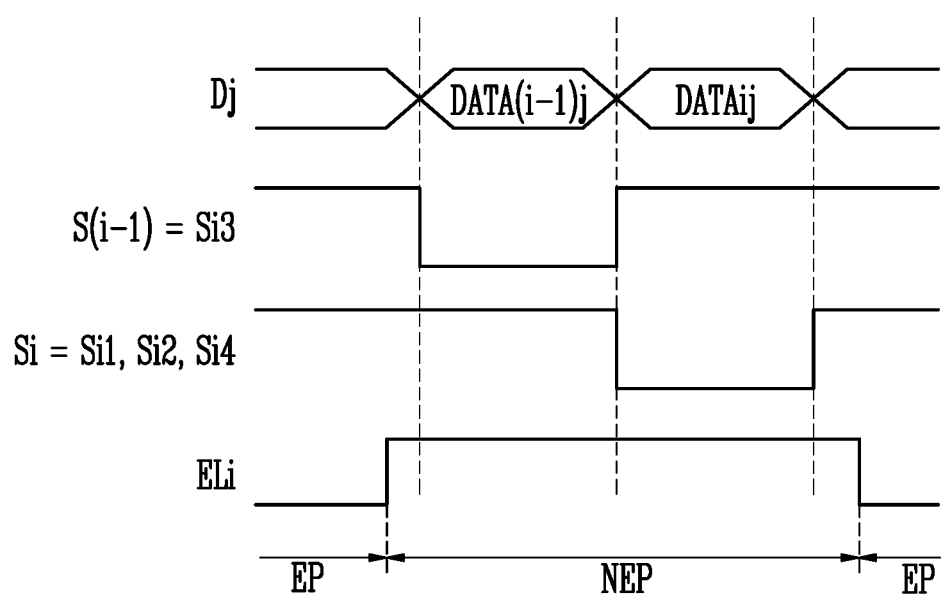

FIGS. 11 to 13 are diagrams illustrating a display device 100 including a pixel PX according to an embodiment of the disclosure. When describing FIG. 11, the same reference numerals are assigned to the same configurations as those in FIG. 2, and a detailed description is omitted.

Referring to FIG. 11, the display device 100 according to an embodiment of the disclosure may include the display unit 110, a scan driver 120', the data driver 130, the timing controller 140, the storage 160, the first temperature sensor 170, the second temperature sensor 180, and an emission driver 190.

The scan driver 120' may generate scan signals to be supplied to scan lines S0 to Sn in response to the control signal from the timing controller 140. The scan driver 120' may sequentially supply a scan signal having a turn-on level of pulse to the scan lines S0 to Sn. For example, the timing controller 140 may supply the control signals such as a start pulse and a clock signal to the scan driver 120'. The scan driver 120' may be implemented as a shift register that sequentially generates and outputs a pulse shape of scan signal by sequentially shifting a pulse shape of start pulse using a clock signal.

The emission driver 190 may supply an emission control signal to emission control lines EL1 to ELp, where "p" is a natural number, in response to a control signal from the timing controller 140. The emission driver 190 may sequentially supply an emission control signal having a turn-off level of pulse to the emission control lines EL1 to ELp. The emission driver 190 may include emission stages configured in a shift register form. The emission driver 190 may generate the emission control signal by sequentially transferring an emission stop signal having a turn-off level of pulse to a next emission stage under control of a clock signal.

FIG. 12 is a diagram illustrating an embodiment of the pixel PX shown in FIG. 11.

Referring to FIG. 12, the pixel PXij includes transistors T11, T12, T13, T14, T15, T16, and T17, a storage capacitor Cst, and a light emitting element LD.

Hereinafter, a circuit configured of a P-type transistor is described as an example. However, those skilled in the art will be able to design a circuit configured of an N-type transistor by differentiating a polarity of a voltage applied to a gate terminal. Similarly, those skilled in the art will be able to design a circuit configured of a combination of a P-type transistor and an N-type transistor. The transistor may be configured in various forms such as a thin film transistor (TFT), a field effect transistor (FET), and a bipolar junction transistor (BJT).

The eleventh transistor T11 may have a gate electrode connected to a first node N1, a first electrode connected to a second node N2, and a second electrode connected to a third node N3. The eleventh transistor T11 may be referred to as a driving transistor.

The twelfth transistor T12 may have a gate electrode connected to a scan line Si1, a first electrode connected to a data line Dj, and a second electrode connected to the second node N2. The twelfth transistor T12 may be referred to as a scan transistor.

The thirteenth transistor T13 may have a gate electrode connected to a scan line Si2, a first electrode connected to the first node N1, and a second electrode connected to the third node N3. The thirteenth transistor T13 may be referred to as a diode connection transistor.

The fourteenth transistor T14 may have a gate electrode connected to a scan line Si3, a first electrode connected to the first node N1, and a second electrode connected to an initialization line INTL. The fourteenth transistor T14 may be referred to as a gate initialization transistor.

The fifteenth transistor T15 may have a gate electrode connected to an i-th emission control line Eli, a first electrode connected to a first power line PL1, and a second electrode connected to the second node N2. The fifteenth transistor T15 may be referred to as an emission transistor. In an embodiment, the gate electrode of the fifteenth transistor T15 may be connected to an emission control line different from an emission control line connected to a gate electrode of the sixteenth transistor T16.

The sixteenth transistor T16 may have the gate electrode connected to the i-th emission control line ELi, a first electrode connected to the third node N3, and a second electrode connected to an anode of the light emitting element LD. The sixteenth transistor T16 may be referred to as an emission transistor.

The seventeenth transistor T17 may have a gate electrode connected to a scan line Si4, a first electrode connected to the initialization line INTL, and a second electrode connected to the anode of the light emitting element LD. The seventeenth transistor T17 may be referred to as a light emitting element initialization transistor.

A first electrode of the storage capacitor Cst may be connected to the first power line PL1 and a second electrode may be connected to the first node N1.

The anode of the light emitting element LD may be connected to the second electrode of the sixteenth transistor T16 and a cathode may be connected to a second power line PL2. The light emitting element LD may be a light emitting diode. The light emitting element LD may be configured of an organic light emitting element (organic light emitting diode), an inorganic light emitting element (inorganic light emitting diode), a quantum dot/well light emitting element (quantum dot/well light emitting diode), or the like. The light emitting element LD may emit light in any one of the first color, the second color, and the third color. In addition, although only one light emitting element LD is provided in each pixel in the present embodiment, a plurality of light emitting elements may be provided in each pixel in an embodiment. At this time, the plurality of light emitting elements may be connected in series, parallel, series-parallel, or the like.

The first power line PL1 may be supplied with a voltage of first power VDD, the second power line PL2 may be supplied with a voltage of second power VSS, and the initialization line INTL may be supplied with a voltage of initialization power. For example, the voltage of the first power may be greater than the voltage of the second power. For example, the voltage of the initialization power may be equal to or greater than the voltage of the second power. For example, the voltage of the initialization power may correspond to a data voltage of the smallest size among data voltages that may be provided. In another example, the size of the voltage of the initialization power may be less than sizes of the data voltages that may be provided.

FIG. 13 is a diagram illustrating a method of driving the pixel of FIG. 12.

Hereinafter, for convenience of description, it is assumed that the scan lines Si1, Si2, and Si4 are i-th scan lines Si and the scan line Si3 is an (i−1)-th scan line S(i−1). However, a connection relationship of the scan lines Si1, Si2, Si3, and Si4 may be various according to embodiments. For example, the scan line Si4 may be the (i−1)-th scan line or an (i+1)-th scan line.

First, an emission control signal of a turn-off level (logic high level) is applied to the i-th emission line ELi, a data signal DATA(i−1)j for an (i−1)-th pixel is applied to the data line Dj, and a scan signal of a turn-on level (logic low level) is applied to the scan line Si3. The high/low of the logic level may vary according to whether a transistor is a P-type or an N-type.

At this time, since a scan signal of a turn-off level is applied to the scan lines Si1 and Si2, the twelfth transistor T12 is turned off and the data signal DATA(i−1)j is prevented from being input to the pixel PXij.

At this time, since the fourteenth transistor T14 is turned on, the first node N1 is connected to the initialization line INTL, and a voltage of the first node N1 is initialized. Since the emission control signal of the turn-off level is applied to the emission control line Ei, the transistors T15 and T16 are turned off, and unnecessary light emission of the light emitting element LD according to an application process of the voltage of the initialization power is prevented.

Next, a data signal DATAij for the i-th pixel PXij is applied to the data line Dj, and the scan signal of the turn-on level is applied to the scan lines Si1 and Si2. Accordingly, the transistors T12, T11, and T13 are turned on, and the data line Dj and the first node N1 are electrically connected to each other. Therefore, a compensation voltage obtained by subtracting a threshold voltage of the eleventh transistor T11 from the data signal DATAij is applied to the second electrode of the storage capacitor Cst, that is, the first node N1, and the storage capacitor Cst maintains a voltage corresponding to a difference between the first power VDD and the compensation voltage. Such a period may be referred to as a threshold voltage compensation period or a data writing period.

In addition, when the scan line Si4 is the i-th scan line, since the seventeenth transistor T17 is turned on, the anode of the light emitting element LD and the initialization line INTL are connected to each other, and the light emitting element LD is initialized to a charge amount corresponding to a voltage difference between the voltage of the initialization power and the voltage of the second power.

Thereafter, as the emission control signal of the turn-on level is applied to the i-th emission control line ELi, the transistors T15 and T16 may be turned on. Therefore, a driving current path connecting the first power line PL1, the fifteenth transistor T15, the eleventh transistor T11, the sixteenth transistor T16, the light emitting element LD, and the second power line PL2 is formed.

A driving current amount flowing to the first electrode and the second electrode of the eleventh transistor T11 is adjusted according to the voltage maintained in the storage capacitor Cst. The light emitting element LD emits light with a luminance corresponding to the driving current amount. The light emitting element LD emits light until the emission control signal of the turn-off level is applied to the emission control line Ei.

When the emission control signal is the turn-on level, pixels receiving the corresponding emission control signal may be in a display state. Therefore, a period in which the emission control signal is the turn-on level may be referred to as an emission period EP (or an emission allowable period). In addition, when the emission control signal is the turn-off level, pixels receiving the corresponding emission control signal may be in a non-display state. Therefore, a period in which the emission control signal is the turn-off level may be referred to as a non-emission period NEP (or an emission disallowable period).

The non-emission period NEP described with reference to FIG. 13 is for preventing the pixel PXij from emitting light with an undesired luminance during the initialization period and the data writing period.

One or more non-emission periods NEP may be additionally provided while the data signal written to the pixel PXij is maintained, for example, one frame period. This may be for effectively expressing a low grayscale by reducing the emission period EP of the pixel PXij, or for smoothly blurring a motion of an image.

Figure 14:
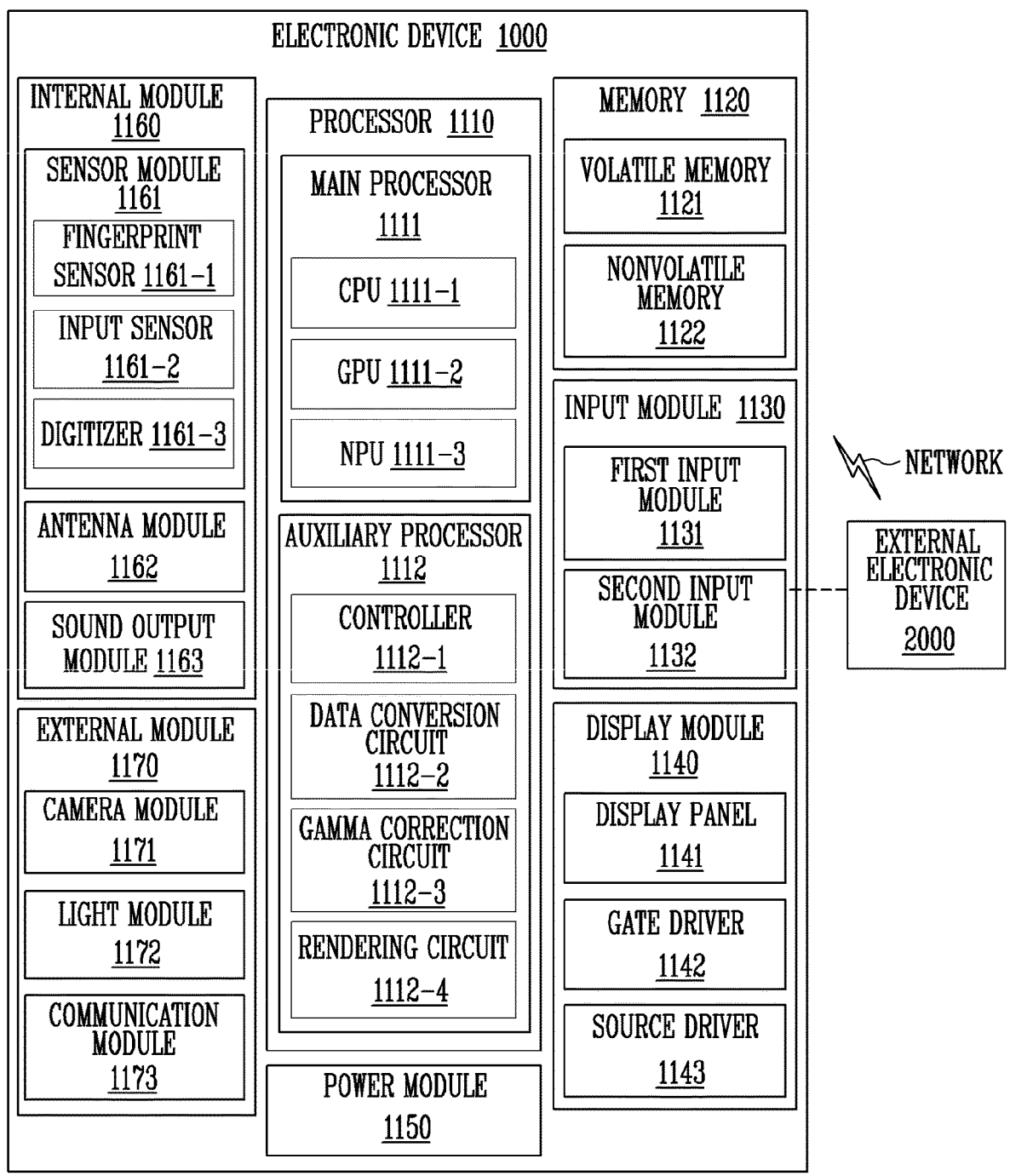
FIG. 14 is a diagram illustrating an electronic device according to an embodiment of the disclosure.

FIG. 14 is a diagram illustrating an electronic device 1000 according to an embodiment of the disclosure.

Referring to FIG. 14, the electronic device 1000 outputs various pieces of information through a display module 1140. The display module 1140 may correspond to at least a portion of the display device 100 of FIG. 2. When a processor 1110 executes an application stored in a memory 1120, the display module 1140 provides application information to a user through a display panel 1141. The display panel 1141 may be a configuration corresponding to the pixel device 100 of FIG. 2. In addition, the memory 1120 may be a configuration including the storage 160 of FIG. 2.

The processor 1110 obtains an external input through an input module 1130 or a sensor module 1161 and executes an application corresponding to the external input. For example, when the user selects a camera icon displayed on the display panel 1141, the processor 1110 obtains a user input through an input sensor 1161-2 and activates a camera module 1171. The processor 1110 transmits image data corresponding to a captured image obtained through the camera module 1171 to the display module 1140. The display module 1140 may display an image corresponding to the captured image through the display panel 1141.

As another example, when personal information authentication is executed in the display module 1140, a fingerprint sensor 1161-1 obtains input fingerprint information as input data. The processor 1110 compares input data obtained through the fingerprint sensor 1161-1 with authentication data stored in a memory 1120 and executes an application according to a comparison result. The display module 1140 may display information executed according to a logic of the application through the display panel 1141.

As still another example, when a music streaming icon displayed on the display module 1140 is selected, the processor 1110 obtains a user input through the input sensor 1161-2 and activates a music streaming application stored in the memory 1120. When a music execution command is input in the music streaming application, the processor 1110 activates a sound output module 1163 to provide sound information corresponding to the music execution command to the user.

In the above, an operation of the electronic device 1000 is briefly described. Hereinafter, a configuration of the electronic device 1000 is described in detail. Some of configurations of the electronic device 1000 to be described later may be integrated and provided as one configuration, and one configuration may be separated into two or more configurations and provided.

The electronic device 1000 may communicate with an external electronic device 2000 through a network, for example, a short-range wireless communication network or a long-range wireless communication network. According to an embodiment, the electronic device 1000 may include the processor 1110, the memory 1120, the input module 1130, the display module 1140, a power module 1150, an internal module 1160, and an external module 1170. According to an embodiment, in the electronic device 1000, at least one of the above-described components may be omitted or one or more other components may be added. According to an embodiment, some of the above-described components, for example, the sensor module 1161, an antenna module 1162, or the sound output module 1163, may be integrated into another component, for example, the display module 1140.

The processor 1110 may execute software to control at least another component, for example, a hardware or software component, of the electronic device 1000 connected to the processor 1110, and perform various data processing or operations. According to an embodiment, as at least a portion of the data processing or operation, the processor 1110 may store a command or data received from another component, for example, the input module 1130, the sensor module 1161, or a communication module 1173, in a volatile memory 1121 and process the command or the data stored in the volatile memory 1121, and result data may be stored in a nonvolatile memory 1122.

The processor 1110 may include a main processor 1111 and an auxiliary processor 1112. The auxiliary processor 1112 may correspond to the timing controller 140 of FIG. 2.

The main processor 1111 may include one or more of a central processing unit (CPU) 1111-1 or an application processor (AP). The main processor 1111 may further include any one or more of a graphic processing unit (GPU) 1111-2, a communication processor (CP), and an image signal processor (ISP). The main processor 1111 may further include a neural processing unit (NPU) 1111-3. The NPU 1111-3 is a processor specialized in processing an artificial intelligence model, and the artificial intelligence model may be generated through machine learning. The artificial intelligence model may include a plurality of artificial neural network layers. The artificial neural network may be one of a deep neural network (DNN), a convolutional neural network (CNN), a recurrent neural network (RNN), a restricted boltzmann machine (RBM), a deep belief network (DBN), a bidirectional recurrent deep neural network (BRDNN), a deep Q-network, or a combination of two or more of the above. Additionally or alternatively, the artificial intelligence model may include a software structure in addition to a hardware structure. At least two of the above-described processing units and processors may be implemented as one integrated configuration, for example, a single chip, or each may be implemented as an independent configuration, for example, a plurality of chips.

The auxiliary processor 1112 may include a controller 1112-1. The controller 1112-1 may include an interface conversion circuit and a timing control circuit. The controller 1112-1 receives an image signal from the main processor 1111, converts a data format of the image signal to correspond to an interface specification with the display module 1140, and outputs image data. The controller 1112-1 may output various control signals necessary for driving the display module 1140.

The auxiliary processor 1112 may further include a data conversion circuit 1112-2, a gamma correction circuit 1112-3, a rendering circuit 1112-4, and the like. The data conversion circuit 1112-2 may receive the image data from the controller 1112-1, compensate the image data to display an image with a desired luminance according to a characteristic of the electronic device 1000, a setting of the user, or the like, or convert the image data for reduction of power consumption, afterimage compensation, or the like. For example, the data conversion circuit 1112-2 may include the first compensator 142 and the second compensator 144 shown in FIG. 5.

The gamma correction circuit 1112-3 may convert the image data, a gamma reference voltage, or the like so that the image displayed on the electronic device 1000 has a desired gamma characteristic. The rendering circuit 1112-4 may receive the image data from the controller 1112-1 and render the image data in consideration of a pixel disposition or the like of the display panel 1141 applied to the electronic device 1000. At least one of the data conversion circuit 1112-2, the gamma correction circuit 1112-3, and the rendering circuit 1112-4 may be integrated into another component, for example, the main processor 1111 or the controller 1112-1. At least one of the data conversion circuit 1112-2, the gamma correction circuit 1112-3, and the rendering circuit 1112-4 may be integrated into a source driver 1143 to be described later.

The memory 1120 may store various data used by at least one component, for example, the processor 1110 or the sensor module 1161, of the electronic device 1000, and input data or output data for a command related thereto. The memory 1120 may include at least one of the volatile memory 1121 and the nonvolatile memory 1122.

The input module 1130 may receive a command or data to be used by a component, for example, the processor 1110, the sensor module 1161, or the sound output module 1163, of the electronic device 1000 from an outside, for example, the user or the external electronic device 2000, of the electronic device 1000.

The input module 1130 may include a first input module 1131 to which a command or data is input from the user and a second input module 1132 to which a command or data is input from the external electronic device 2000. The first input module 1131 may include a microphone, a mouse, a keyboard, a key, for example, a button, or a pen, for example, a passive pen or an active pen. The second input module 1132 may support a designated protocol capable of connecting to the external electronic device 2000 by wire or wirelessly. According to an embodiment, the second input module 1132 may include a high definition multimedia interface (HDMI), a universal serial bus (USB) interface, an SD card interface, or an audio interface. The second input module 1132 may include a connector capable of physically connecting to the external electronic device 2000, for example, an HDMI connector, a USB connector, an SD card connector, or an audio connector, for example, a headphone connector.

The display module 1140 visually provides information to the user. The display module 1140 may include the display panel 1141, a gate driver 1142, and the source driver 1143. The gate driver 1142 may correspond to at least a portion of the scan driver 120 shown in FIG. 2. The source driver 1143 may correspond to at least a portion of the data driver 130 shown in FIG. 2. The display module 1140 may further include a window, a chassis, and a bracket for protecting the display panel 1141.

The display panel 1141 (or a display) may include a liquid crystal display panel, an organic light emitting display panel, or an inorganic light emitting display panel, and a type of the display panel 1141 is not particularly limited. The display panel 1141 may be a rigid type or a flexible type that may be rolled or folded. The display module 1140 may further include a supporter, a bracket, a heat dissipation member, or the like that supports the display panel 1141.

The gate driver 1142 may be mounted on the display panel 1141 as a driving chip. In addition, the gate driver 1142 may be integrated in the display panel 1141. For example, the gate driver 1142 may include an amorphous silicon TFT gate driver circuit (ASG), a low temperature polycrystalline silicon (LTPS) TFT gate driver circuit, or an oxide semiconductor TFT gate driver circuit (OSG) built in the display panel 1141. The gate driver 1142 receives a control signal from the controller 1112-1 and outputs scan signals to the display panel 1141 in response to the control signal.

The display module 1140 may further include an emission driver. The emission driver may correspond to the emission driver 190 shown in FIG. 11. The emission driver outputs an emission control signal to the display panel 1141 in response to the control signal received from the controller 1112-1. The emission driver may be formed separately from the gate driver 1142 or may be integrated into the gate driver 1142.

The source driver 1143 receives a control signal from the controller 1112-1, converts image data into an analog voltage, for example, a data signal, in response to the control signal, and then outputs the data signals to the display panel 1141.

The source driver 1143 may be integrated into another component, for example, the controller 1112-1. A function of the interface conversion circuit and the timing control circuit of the controller 1112-1 described above may be integrated into the source driver 1143.

The display module 1140 may further include a voltage generation circuit. The voltage generation circuit may output various voltages necessary for driving the display panel 1141. In an embodiment, the display panel 1141 may include a plurality of pixel columns each including a plurality of pixels.

In an embodiment, the source driver 1143 may convert data corresponding to red (R), green (G), and blue (B), for example, the output data Dout, into a red data signal (or data voltage), a green data signal, and the blue data signal, and may provide the red data signal, the green data signal, and the blue data signal to the plurality of pixel columns included in the display panel 1141 during one horizontal period.

The power module 1150 supplies power to a component of the electronic device 1000. The power module 1150 may include a battery that charges a power voltage. The battery may include a non-rechargeable primary cell, and a rechargeable secondary cell or fuel cell. The power module 1150 may include a power management integrated circuit (PMIC). The PMIC supplies optimized power to each of the above-described module and a module to be described later. The power module 1150 may include a wireless power transmission/reception member electrically connected to the battery. The wireless power transmission/reception member may include a plurality of antenna radiators of a coil form.

The electronic device 1000 may further include the internal module 1160 and the external module 1170. The internal module 1160 may include the sensor module 1161, the antenna module 1162, and the sound output module 1163. The external module 1170 may include the camera module 1171, a light module 1172, and the communication module 1173.

The sensor module 1161 may sense an input by a body of the user or an input by a pen among the first input module 1131, and may generate an electrical signal or a data value corresponding to the input. The sensor module 1161 may include at least one of the fingerprint sensor 1161-1, the input sensor 1161-2, and a digitizer 1161-3.

The fingerprint sensor 1161-1 may generate a data value corresponding to a fingerprint of the user. The fingerprint sensor 1161-1 may include any one of an optical type fingerprint sensor or a capacitive type fingerprint sensor.

The input sensor 1161-2 may generate a data value corresponding to coordinate information of the input by the body of the user or the pen. The input sensor 1161-2 generates a capacitance change amount by the input as the data value. The input sensor 1161-2 may sense an input by the passive pen or may transmit/receive data to and from the active pen.

The input sensor 1161-2 may measure a biometric signal such as blood pressure, water, or body fat. For example, when the user touches a sensor layer or a sensing panel with a body part and does not move during a certain time, the input sensor 1161-2 may sense the biometric signal based on a change of an electric field by the body part and output information desired by the user to the display module 1140.

The digitizer 1161-3 may generate a data value corresponding to coordinate information of the input by the pen. The digitizer 1161-3 generates an electromagnetic change amount by the input as the data value. The digitizer 1161-3 may sense the input by the passive pen or may transmit/receive data to and from the active pen.

At least one of the fingerprint sensor 1161-1, the input sensor 1161-2, and the digitizer 1161-3 may be implemented as the sensor layer formed on the display panel 1141 through a continuous process. The fingerprint sensor 1161-1, the input sensor 1161-2, and the digitizer 1161-3 may be disposed above the display panel 1141, and any one of the fingerprint sensor 1161-1, the input sensor 1161-2, and the digitizer 1161-3, for example, the digitizer 1161-3 may be disposed below the display panel 1141.

At least two of the fingerprint sensor 1161-1, the input sensor 1161-2, and the digitizer 1161-3 may be formed to be integrated into one sensing panel through the same process. When at least two of the fingerprint sensor 1161-1, the input sensor 1161-2, and the digitizer 1161-3 are integrated into one sensing panel, the sensing panel may be disposed between the display panel 1141 and a window disposed above the display panel 1141. According to an embodiment, the sensing panel may be disposed on the window, and a position of the sensing panel is not particularly limited.

At least one of the fingerprint sensor 1161-1, the input sensor 1161-2, and the digitizer 1161-3 may be embedded in the display panel 1141. That is, at least one of the fingerprint sensor 1161-1, the input sensor 1161-2, and the digitizer 1161-3 may be simultaneously formed through a process of forming elements, for example, a light emitting element, a transistor, and the like, included in the display panel 1141.

In addition, the sensor module 1161 may generate an electrical signal or a data value corresponding to an internal state or an external state of the electronic device 1000. The sensor module 1161 may further include, for example, a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The antenna module 1162 may include one or more antennas for transmitting a signal or power to an outside or receiving a signal or power from an outside. According to an embodiment, the communication module 1173 may transmit a signal to an external electronic device or receive a signal from an external electronic device through an antenna suitable for a communication method. An antenna pattern of the antenna module 1162 may be integrated into one configuration, for example, the display panel 1141, of the display module 1140 or the input sensor 1161-2.

The sound output module 1163 is a device for outputting a sound signal to an outside of the electronic device 1000, and may include, for example, a speaker used for general purposes such as multimedia playback or recording playback, and a receiver used exclusively for receiving a call. According to an embodiment, the receiver may be formed integrally with or separately from the speaker. A sound output pattern of the sound output module 1163 may be integrated into the display module 1140.

The camera module 1171 may capture a still image and a moving image. According to an embodiment, the camera module 1171 may include one or more lenses, an image sensor, or an image signal processor. The camera module 1171 may further include an infrared camera capable of measuring presence or absence of the user, a position of the user, a gaze of the user, and the like.

The light module 1172 may provide light. The light module 1172 may include a light emitting diode or a xenon lamp. The light module 1172 may operate in conjunction with the camera module 1171 or may operate independently.

The communication module 1173 may support establishment of a wired or wireless communication channel between the electronic device 1000 and the external electronic device 2000 and communication performance through the established communication channel. The communication module 1173 may include any one or both of a wireless communication module such as a cellular communication module, a short-range wireless communication module, or a global navigation satellite system (GNSS) communication module, and a wired communication module such as a local area network (LAN) communication module or a power line communication module. The communication module 1173 may communicate with the external electronic device 2000 through a short-range communication network such as Bluetooth, WiFi direct, or infrared data association (IrDA), or a long-range communication network such as a cellular network, the Internet, or a computer network, for example, LAN or WAN. The above-described various types of communication modules 1173 may be implemented as a single chip or as separate chips.

The input module 1130, the sensor module 1161, the camera module 1171, and the like may be used to control an operation of the display module 1140 in conjunction with the processor 1110.

The processor 1110 outputs a command or data to the display module 1140, the sound output module 1163, the camera module 1171, or the light module 1172 based on input data received from the input module 1130. For example, the processor 1110 may generate image data in response to the input data applied through a mouse, an active pen, or the like and output the image data to the display module 1140, or generate command data in response to the input data and output the command data to the camera module 1171 or the light module 1172. When the input data is not received from the input module 1130 during a certain time, the processor 1110 may convert an operation mode of the electronic device 1000 to a low power mode or a sleep mode to reduce power consumed in the electronic device 1000.

The processor 1110 outputs a command or data to the display module 1140, the sound output module 1163, the camera module 1171, or the light module 1172 based on sensing data received from the sensor module 1161. For example, the processor 1110 may compare authentication data applied by the fingerprint sensor 1161-1 with authentication data stored in the memory 1120 and then execute an application according to a comparison result. The processor 1110 may execute the command based on sensing data sensed by the input sensor 1161-2 or the digitizer 1161-3 or output corresponding image data to the display module 1140. When the sensor module 1161 includes a temperature sensor, the processor 1110 may receive temperature data for a measured temperature from the sensor module 1161 and further perform luminance correction or the like on the image data based on the temperature data.

The processor 1110 may receive measurement data for the presence of the user, the position of the user, the gaze of the user, and the like, from the camera module 1171. The processor 1110 may further perform luminance correction or the like on the image data based on the measurement data. For example, the processor 1110 determining the presence or absence of the user through an input from the camera module 1171 may output image data of which a luminance is corrected through the data conversion circuit 1112-2 or the gamma correction circuit 1112-3 to the display module 1140.

Some of the above-described components may be connected to each other through a communication method between peripheral devices, for example, a bus, general purpose input/output (GPIO), a serial peripheral interface (SPI), a mobile industry processor interface (MIPI), or an ultra path interconnect (UPI) link to exchange a signal, for example, a command or data, with each other. The processor 1110 may communicate with the display module 1140 through a mutually agreed interface, for example, may use any one of the above-described communication methods.

Although the above has been described with reference to the embodiments of the disclosure, those skilled in the art will understand that the disclosure may be variously corrected and modified within the scope without departing from the spirit and scope of the disclosure described in the claims.

What is claimed is:

1. A display device comprising:
   a display unit including pixels connected to data lines and scan lines;
   a first temperature sensor for sensing a first temperature of the display unit and a second temperature sensor for sensing a second temperature of the display unit;
   a data driver configured to generate a data signal configured to be supplied to the data lines using output data, and attached to a first printed circuit board configured to be fixed to a rear surface of the display unit;
   a timing controller configured to generate the output data using input data, and attached to a second printed circuit board configured to be fixed to the rear surface of the display unit; and
   a storage having a temperature weight table including a weight corresponding to the first and second temperatures and a plurality of temperature tables including temperature information of the display unit corresponding to an attachment position of the second printed circuit board,
   wherein the timing controller determines the attachment position of the second printed circuit board in response to the first temperature from the first temperature sensor and the second temperature from the second temperature sensor, and corrects the input data using a specific temperature table of the temperature tables, the specific temperature table corresponding to the attachment position of the second printed circuit board.

2. The display device according to claim 1, wherein the first temperature sensor is mounted on the first printed circuit board, and the second temperature sensor is mounted on the second printed circuit board.

3. The display device according to claim 1, wherein the display unit includes a first color pixel configured to emit light of a first color, a second color pixel configured to emit light of a second color, and a third color pixel configured to emit light of a third color, and the first color, the second color, and the third color are different colors.

4. The display device according to claim 3, wherein the temperature weight table includes a first weight of the first color pixel, a second weight of the second color pixel, and a third weight of the third color pixel corresponding to a plurality of respective temperatures.

5. The display device according to claim 4, wherein the display unit is divided into a plurality of blocks, and each of the plurality of temperature tables includes temperature information of the plurality of blocks corresponding to the attachment position of the second printed circuit board.

6. The display device according to claim 5, wherein the timing controller comprises:
   a comparator configured to obtain a difference value between the first temperature and the second temperature;
   a determiner configured to select a temperature table of the plurality of temperature tables using the difference value, and select the first weight, the second weight and the third weight in a unit of the plurality of blocks in response to a temperature of the plurality of blocks; and
   a second compensator configured to generate the output data by applying the first weight, the second weight, and the third weight in the unit of the plurality of blocks.

7. The display device according to claim 6, wherein the timing controller further comprises a first compensator for generating first data by applying an optical measurement result of the display unit and a gamma value corresponding to a position of the display unit to the input data.

8. The display device according to claim 7, wherein the second compensator generates the output data by applying the first weight, the second weight, and the third weight to the first data in the unit of the plurality of blocks.

9. A display device comprising:
   a data driver mounted on a first printed circuit board, and configured to generate a data signal using output data;
   a timing controller mounted on a second printed circuit board and configured to correct input data to generate the output data;
   a first temperature sensor mounted on the first printed circuit board;
   a second temperature sensor mounted on the second printed circuit board; and
   a storage having a plurality of temperature tables storing temperature information of a display unit corresponding to an attachment position of the second printed circuit board,
   wherein the timing controller determines a temperature of the display unit using a temperature table of the plurality of temperature tables in response to a measurement result of the first temperature sensor and the second temperature sensor, and corrects the input data in response to the temperature of the display unit to generate the output data.

10. The display device according to claim 9, wherein the timing controller corrects the input data to generate the output data so that an image of a uniform luminance is displayed regardless of the temperature of the display unit.

11. The display device according to claim 9, wherein the timing controller selects the temperature table of the plurality of temperature tables using a difference value between a first temperature measured from the first temperature sensor and a second temperature measured from the second temperature sensor.

12. A method of driving a display device, the method comprising:
- receiving a first temperature from a first temperature sensor mounted on a first printed circuit board including a data driver;
- receiving a second temperature from a second temperature sensor mounted on a second printed circuit board including a timing controller;
- determining an attachment position of the second printed circuit board in a display unit using the first temperature and the second temperature; and
- determining a temperature of the display unit in response to the attachment position of the second printed circuit board, and correcting data supplied from the timing controller to the data driver in response to the temperature of the display unit.

13. The method according to claim 12, further comprising:
- dividing the display unit into a plurality of blocks and storing the temperature of the display unit when attached to the second printed circuit board in each of the blocks as a plurality of temperature tables.

14. The method according to claim 13, wherein in determining the attachment position of the second printed circuit board, a temperature table of the plurality of temperature tables is selected using the first temperature and the second temperature.

15. The method according to claim 14, wherein the temperature table of the plurality of temperature tables is selected in response to a difference value between the first temperature and the second temperature.

16. The method according to claim 12, wherein the correcting the data comprises correcting the data so that an image of a uniform luminance is displayed regardless of the temperature of the display unit.

17. The method according to claim 12, wherein the display unit includes a first color pixel generating light of a first color and a second color pixel generating light of a second color different from the first color, and
the method further comprises storing first weights of the first color pixel and second weights of the second color pixel corresponding to a plurality of temperatures.

18. The method according to claim 17, wherein the correcting the data comprises correcting the data using the first weights and the second weights.

* * * * *